(12) United States Patent
Benaissa et al.

(10) Patent No.: US 8,134,204 B2
(45) Date of Patent: Mar. 13, 2012

(54) DEMOS TRANSISTORS WITH STI AND COMPENSATED WELL IN DRAIN

(75) Inventors: Kamel Benaissa, Dallas, TX (US); Hisashi Shichijo, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 157 days.

(21) Appl. No.: 12/536,810

(22) Filed: Aug. 6, 2009

(65) Prior Publication Data
US 2010/0032755 A1 Feb. 11, 2010

Related U.S. Application Data

(60) Provisional application No. 61/086,689, filed on Aug. 6, 2008.

(51) Int. Cl.
*H01L 27/088* (2006.01)
(52) U.S. Cl. ... 257/337; 257/339; 257/343; 257/E27.06; 257/E29.261
(58) Field of Classification Search .......... 257/335–337, 257/339, 343, E21.417, E29.261, E27.06, 257/E21.437, E21.334, E29.256
See application file for complete search history.

(56) References Cited

U.S. PATENT DOCUMENTS 6,670,685 B2 * 12/2003 Pendharkar .................. 257/409
2003/0109112 A1 * 6/2003 Wu ............................... 438/400

* cited by examiner

*Primary Examiner* — Davienne Monbleau
*Assistant Examiner* — Whitney T Moore
(74) *Attorney, Agent, or Firm* — Jacqueline J. Garner; Wade J. Brady, III; Frederick J. Telecky, Jr.

(57) ABSTRACT

A drain extended MOS (DEMOS) transistor with an element of field oxide separating the drain contact from the gate, and a compensation region of opposite polarity in the drain under the gate, is disclosed. The inventive DEMOS may be fabricated in a CMOS IC without adding any process steps. Both n-channel and p-channel versions may be fabricated in CMOS ICs with an n-type buried layer. Furthermore, the inventive transistor may be fabricated in an IC built in an SOI wafer. The width of the compensation region may be varied across multiple instances of the inventive DEMOS transistor to provide a capability for handling multiple signals with different voltage levels in the same IC without adding fabrication steps. The compensation region may be biased by a control voltage to modulate the depletion of the drain extension and provide a capability for handling multiple signal voltage levels in a single transistor.

12 Claims, 16 Drawing Sheets

US 8,134,204 B2

DEMOS TRANSISTORS WITH STI AND COMPENSATED WELL IN DRAIN

FIELD OF THE INVENTION

This invention relates to the field of integrated circuits. More particularly, this invention relates to drain extended MOS transistors in integrated circuits.

BACKGROUND OF THE INVENTION

It is common for integrated circuits (ICs) to have circuits which operate at the power supply voltage of the IC and include drain extended metal oxide semiconductor (DEMOS) transistors which manipulate input and output signals with voltages above the power supply voltage. DEMOS transistors of any given architecture are limited to a maximum operating drain voltage which depends on the details of the architecture. It is desirable to increase the maximum operating drain voltage without adding cost or complexity to the fabrication process sequence of the IC.

SUMMARY OF THE INVENTION

This Summary is provided to comply with 37 C.F.R. §1.73, suggesting a summary of the invention briefly indicating the nature and substance of the invention. It is submitted with the understanding that it will not be used to interpret or limit the scope or meaning of the claims.

The instant invention provides a DEMOS transistor with a field oxide region and a compensated region separating a drain contact region from the channel of the transistor. The inventive DEMOS transistor may be implemented as both n-channel and p-channel embodiments in complementary metal oxide semiconductor (CMOS) ICs without adding process steps to the IC fabrication process sequence. The width of the compensation region may be varied in multiple instances of the inventive DEMOS transistor in an IC to provide a capability for handling multiple signals with different voltage levels. The compensation region may be connected to a control voltage that modulates the depletion of the drain extension, providing a capability for handling multiple signals with different voltage levels with a single transistor. A method of fabricating an IC with the inventive DEMOS transistor is also claimed.

DETAILED DESCRIPTION

Figure 1A:
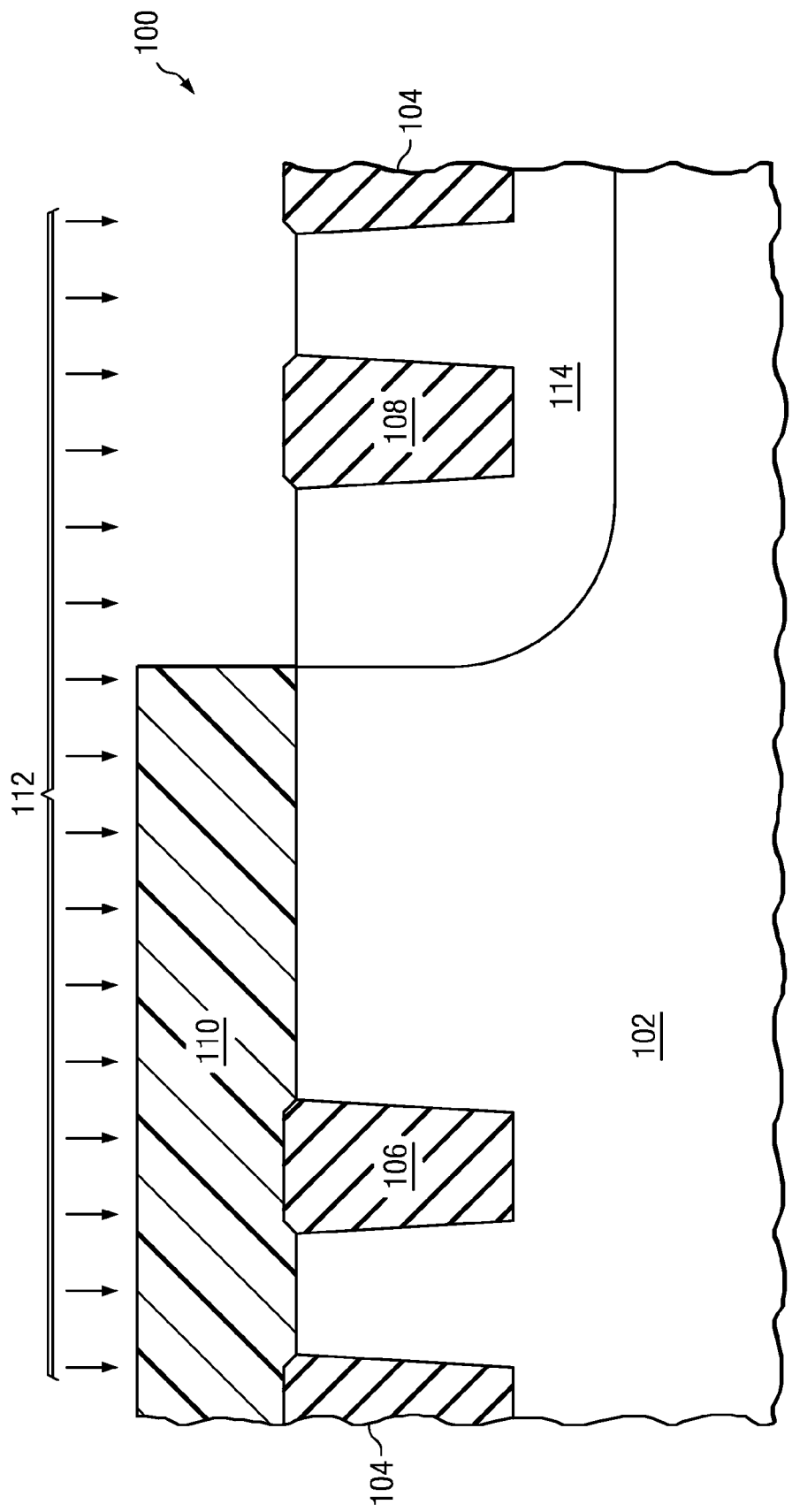
FIG. 1A through FIG. 1C are cross-sections of an IC built on a p-type substrate with a n-channel DEMOS (DENMOS) transistor formed according to an embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The need for drain extended metal oxide semiconductor (DEMOS) transistors which can operate at higher drain voltages is addressed by the instant invention, which provides a DEMOS transistor with a field oxide region and a compensated region separating a drain contact region from the channel of the transistor. The inventive DEMOS transistor may be implemented as both n-channel and p-channel embodiments in complementary metal oxide semiconductor (CMOS) ICs without adding process steps to the IC fabrication process sequence.

Figure 1B:
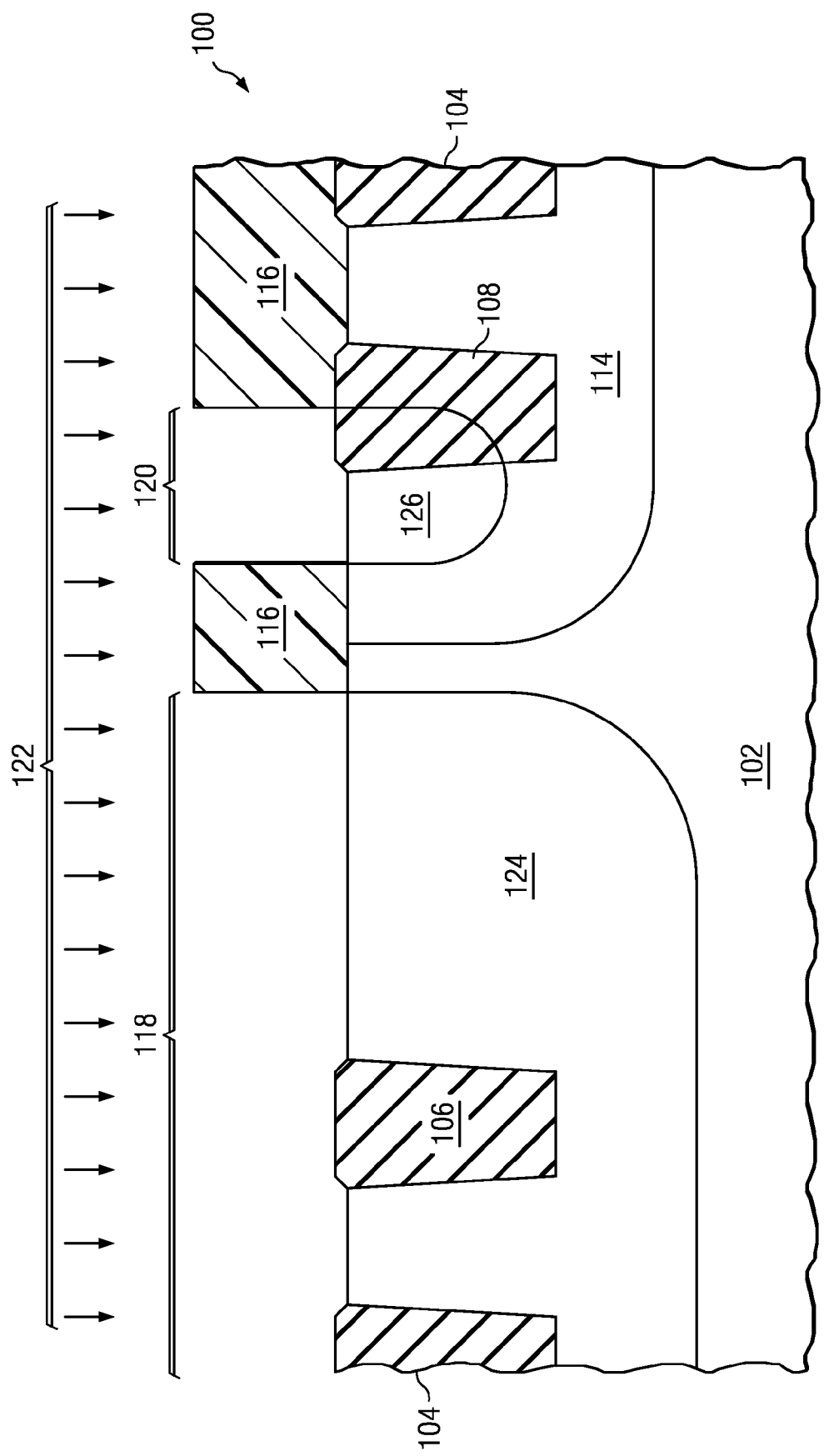
Figure 1C:
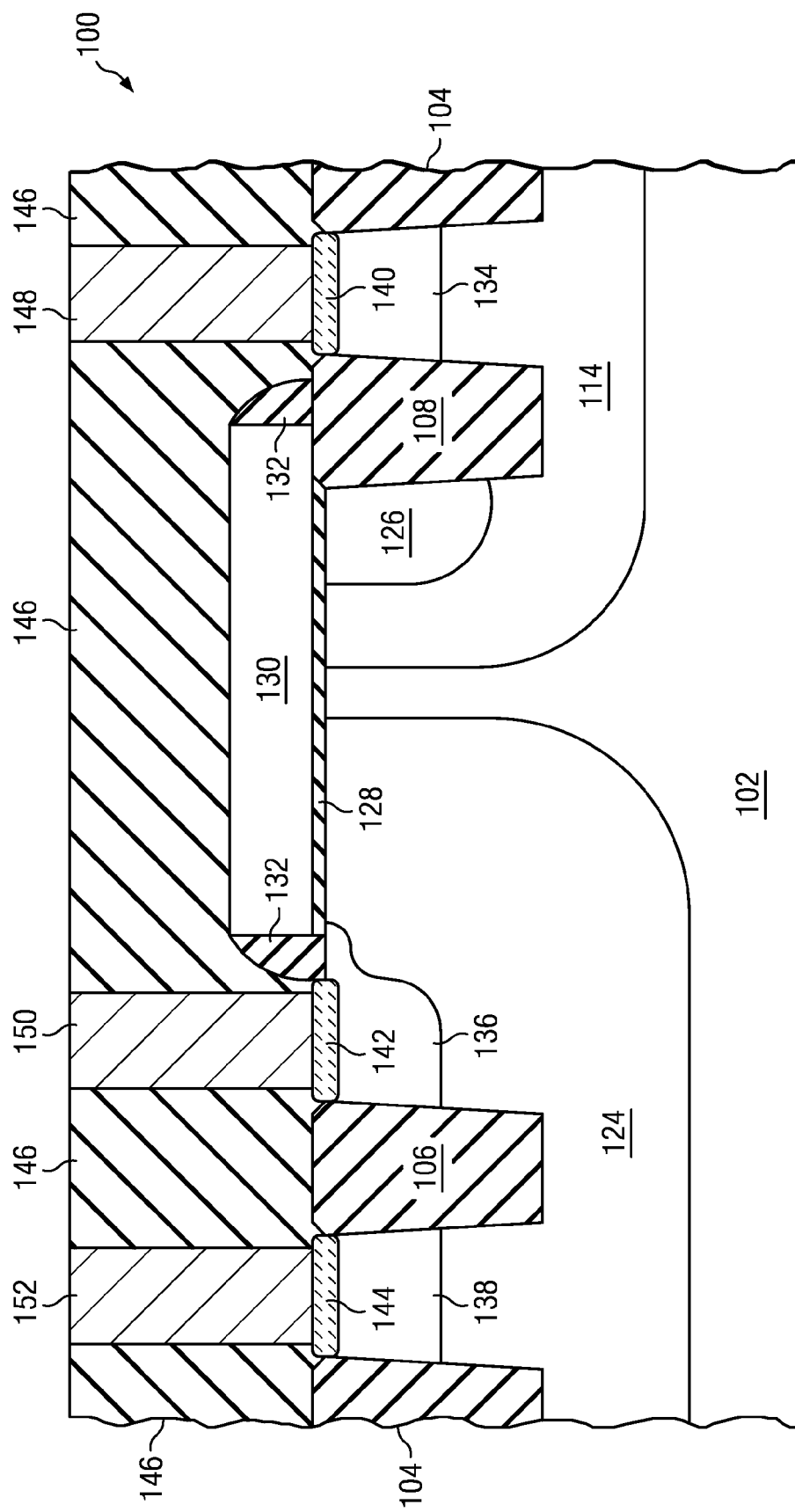

FIG. 1A through FIG. 1C are cross-sections of an IC built on a p-type substrate with a n-channel DEMOS (DENMOS) transistor formed according to an embodiment of the instant invention. Referring to FIG. 1A, the IC (100) includes a p-type substrate (102), which may be a monolithic single crystal wafer, commonly with an electrical resistivity between 0.5 and 5 ohm-cm, a wafer with a layer of p-type epitaxial single crystal silicon, commonly with an electrical resistivity between 5 and 500 ohm-cm, or any other substrate suitable for fabrication of the IC (100) with a single crystal p-type layer forming a top surface of the substrate (102). Elements of field oxide (104, 106, 108), typically silicon dioxide 250 to 600 nanometers deep, commonly formed by shallow trench isolation (STI), high aspect ratio processing (HARP) or local oxidation of silicon (LOCOS), are formed at a top surface of the substrate (102) to provide lateral electrical isolation between elements of the IC (100) in the substrate (102). Field oxide elements (104) provide lateral electrical isolation between the DENMOS transistor and other components in the substrate (102). A region is defined for an n-type well, commonly known as an n-well, by an n-well photoresist pattern (110) on the top surface of the substrate (102), which is formed by known photolithographic processes. The n-well region includes area in the substrate (102) on both sides of field oxide element (108). A first set of n-type dopants (112), typically phosphorus and/or arsenic, are ion implanted into the IC (100), to form the n-well (114). The n-well photoresist pattern (110) blocks the first set of n-type dopants (112) from regions in the substrate (102) not defined for the n-well (114). The ion implantation process to form the n-well (114) typically includes several steps in which n-type dopants are ion implanted at different energies and different doses so as to form a continuous n-type region from the top surface of the substrate (102) to a depth below a bottom surface of the field oxide (108), commonly 400 to 800 nanometers. A typical total dose of the first set of n-type dopants (112) is between $1 \cdot 10^{12}$ cm$^{-2}$ and $1 \cdot 10^{15}$ cm$^{-2}$. A typical maximum ion implant energy for the first set of n-type dopants (112) is between 200 and 700 keV. The n-well photoresist pattern (110) is removed after the n-well ion implantation process, typically by etching the photoresist material in an oxygen containing plasma followed by a wet chemical cleanup of any photoresist residue. The n-well (114) forms a drain of the DENMOS transistor.

FIG. 1B depicts the IC (100) at a further stage of fabrication. A p-well photoresist pattern (116) is formed on a top surface of the substrate (102) to define a p-well area (118) for a p-type well in the substrate (102), commonly known as a p-well, and a p-type compensation area (120) for a p-type compensation region in the substrate (102). A first set of p-type dopants (122) typically boron and, less commonly gallium, are ion implanted into the IC (100) to form the p-well (124) and a p-type compensation region (126). The p-type compensation region (126) is within the boundaries of the n-well (114) under a region defined for a DENMOS gate and overlaps the field oxide element (108). Furthermore, the p-type compensation region (126) extends from the top surface of the substrate (102) downward to less than the depth of the field oxide element (108), and does not extend to the p-type region in the substrate (102) below the n-well (114). The p-well photoresist pattern (116) blocks the first set of p-type dopants (122) from regions in the substrate (102) not defined for the p-well region (118) or the p-type compensation region (120). The ion implantation process to form the p-well (124) typically includes several steps in which p-type dopants are ion implanted at different energies and different doses so as to form a continuous p-type region from the top surface of the substrate (102) to a depth below a bottom surface of the field oxide (106), commonly 500 to 1000 nanometers. A typical total dose of the first set of p-type dopants (122) is between $1 \cdot 10^{12}$ cm$^{-2}$ and $1 \cdot 10^{15}$ cm$^{-2}$. A typical maximum ion implant energy for the first set of p-type dopants (122) is between 100 and 600 keV. The p-well photoresist pattern (116) is removed after the p-well ion implantation process, typically by etching the photoresist material in an oxygen containing plasma followed by a wet chemical cleanup of any photoresist residue.

It is within the scope of the instant invention to perform the n-well and p-well ion implantation steps in any order.

FIG. 1C depicts the IC (100) after formation of the inventive DENMOS transistor is completed. A metal oxide semiconductor (MOS) gate dielectric layer (128), typically silicon dioxide, nitrogen doped silicon dioxide, silicon oxy-nitride, hafnium oxide, layers of silicon dioxide and silicon nitride, or other insulating material, commonly 1 to 5 nanometers thick, is formed on top surfaces of the n-well (114), p-well (124) and substrate (102). A DEMOS gate (130) is formed by depositing a layer of gate material, typically polycrystalline silicon, known as polysilicon, commonly 50 to 200 nanometers thick, on a top surface of the MOS gate dielectric layer (128), defining a region for the DEMOS gate (130) with a photoresist pattern using known photolithographic methods, and removing unwanted gate material by known etching methods. Gate sidewall spacers (132) are formed on lateral surfaces of the DEMOS gate (130) by depositing a layer of silicon nitride or silicon dioxide, or a stack of silicon nitride and silicon dioxide layers, on a top surface and the lateral surfaces of the DEMOS gate (130) and top surfaces of the n-well (114) and p-well (124), followed by an anisotropic etch process which removes the deposited material from the top surfaces of the DEMOS gate (130), n-well (114) and p-well (124).

Still referring to FIG. 1C, an n-type drain contact region (134) and an n-type source contact region (136) are formed by ion implantation of a second set of n-type dopants, typically phosphorus, arsenic and/or antimony, commonly with a total dose between $1 \cdot 10^{14}$ cm$^{-2}$ and $3 \cdot 10^{16}$ cm$^{-2}$, at energies between 5 and 200 keV. An n-type source-drain photoresist pattern, not shown in FIG. 1C for clarity, defines the n-type drain contact region (134) and n-type source contact region (136) during ion implantation of the second set of n-type dopants. A p-type substrate contact region (138) is formed by ion implantation of a second set of p-type dopants, typically boron, gallium and/or indium, commonly with a total dose between $1 \cdot 10^{14}$ cm$^{-2}$ and $3 \cdot 10^{16}$ cm$^{-2}$, at energies between 2 and 100 keV. A p-type source-drain photoresist pattern, not shown in FIG. 1C for clarity, defines the p-type substrate contact region (138) during ion implantation of the second set of p-type dopants.

Continuing to refer to FIG. 1C, metal silicide is formed on the n-type drain contact region (134), n-type source contact region (136) and p-type substrate contact region (138) by depositing a refractory metal, such as titanium, cobalt or nickel, on the top surfaces of the contact regions (134, 136, 138), followed by depositing an optional cap layer over the refractory metal, reacting the refractory metal with silicon in the contact regions during a thermal process to form metal silicide, and removing unreacted refractory metal and cap layer material, to form a drain silicide contact layer (140), a source silicide contact layer (142) and a substrate silicide contact layer (144) on top surfaces of the respective contact regions (134, 136, 138).

Continuing to refer to FIG. 1C, a pre-metal dielectric layer (PMD) (146), typically a dielectric layer stack including a silicon nitride or silicon dioxide PMD liner 10 to 100 nanometers thick deposited by plasma enhanced chemical vapor deposition (PECVD), a layer of silicon dioxide, phosphosilicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on top surfaces of the DEMOS gate (130) and the silicide contact layers (140, 142, 144). A drain contact (148), a source contact (150) and a substrate contact (152) are formed in the PMD (146), typically by defining regions for contact holes with a contact photoresist pattern on a top surface of the PMD (146), not shown in FIG. 1C for clarity, removing PMD material in the regions defined by the contact photoresist pattern using known etching methods to expose the silicide contact layers (140, 142, 144), depositing contact metal, typically tungsten, in the contact holes, and selectively removing the contact metal from the top surface of the PMD (146), commonly by known CMP and/or etching processes. A gate contact, not shown in FIG. 1C for clarity, is also formed which connects to the DEMOS gate (130).

During operation of the DENMOS transistor described by the above embodiment, the source contact (150) and substrate contact (152) are typically connected to potentials within 1 volt of ground potential, and a positive drain potential, typically greater than 4 volts, is applied to the drain contact (148). A portion of the n-well (114) adjacent to the p-type compensation region (126) is depleted, causing a significant fraction of the potential difference between the drain contact (148) and the source contact (150) to occur across the depleted n-well region, resulting in a desirably lower electric field at an interface between the n-well (114) and the MOS gate dielectric layer (128) than would exist in the absence of the p-type compensation region (126). Formation of the p-type compensation region (126) simultaneously with the p-well (124) is advantageous because it provides the benefit of the p-type compensation region without adding fabrication cost or complexity.

In a further embodiment, a second DENMOS transistor with a second p-type compensation region is formed in the IC (100) in which a width of the second p-type compensation region is different than a width of the p-type compensation region in the first DENMOS transistor, providing a DENMOS transistor with a different drain voltage and drive current capability compared to the first DENMOS transistor. This is advantageous because it provides a capability of optimally handling more than one input and output signal with different voltages in the same IC without adding fabrication cost or complexity.

In a preferred embodiment, the p-type compensation region (126) is connected to a control potential that can vary a depletion width between the p-type compensation region (126) and the n-well (114). This is advantageous because it provides a method of changing a drain voltage and drive current capability of a single DENMOS transistor, during operation of the IC (100), without adding fabrication cost or complexity.

Figure 2A:
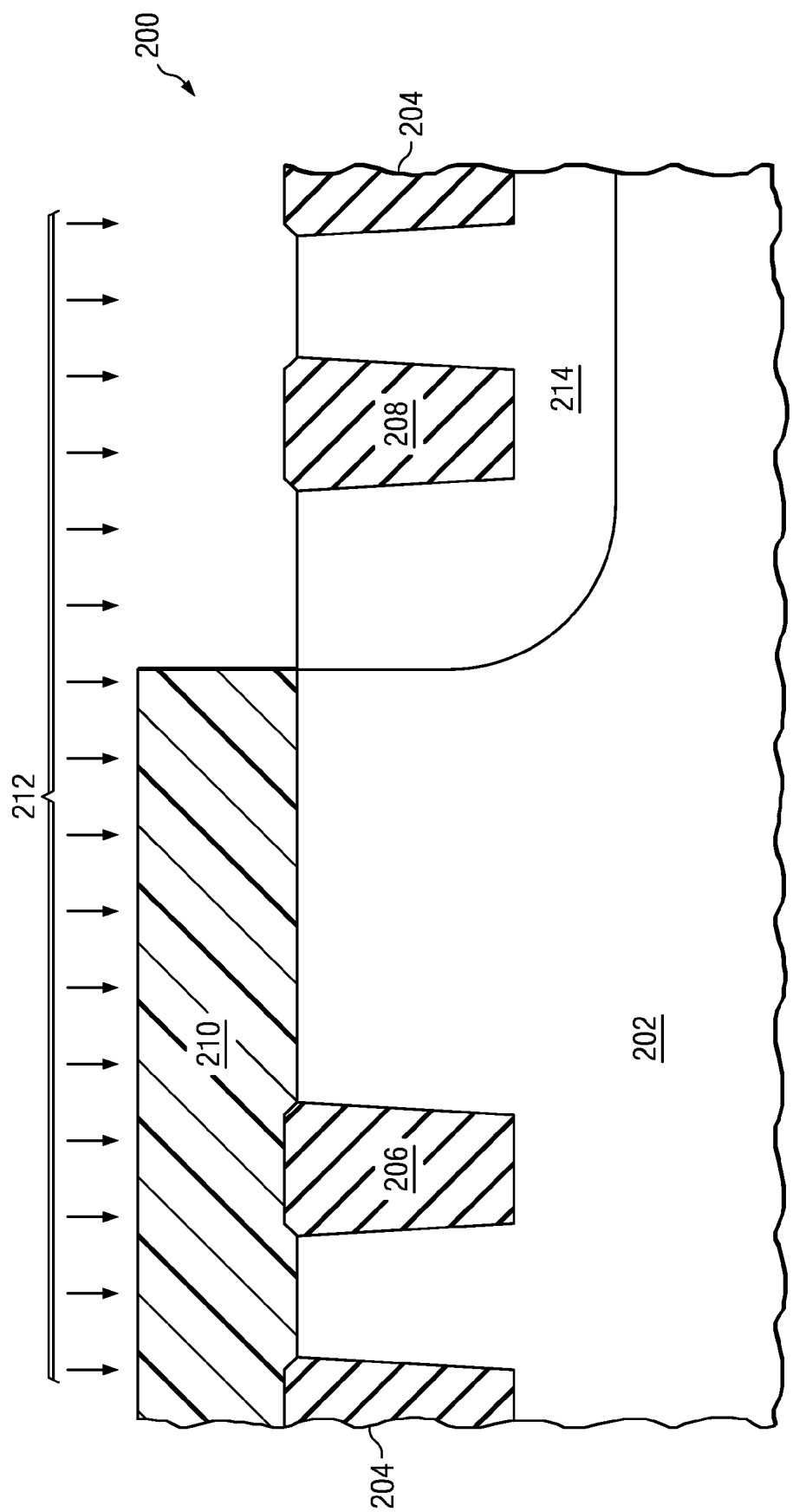
FIG. 2A through FIG. 2C are cross-sections of an IC built on a n-type substrate with a p-channel DEMOS (DEPMOS) transistor formed according to another embodiment of the instant invention.
Figure 2B:
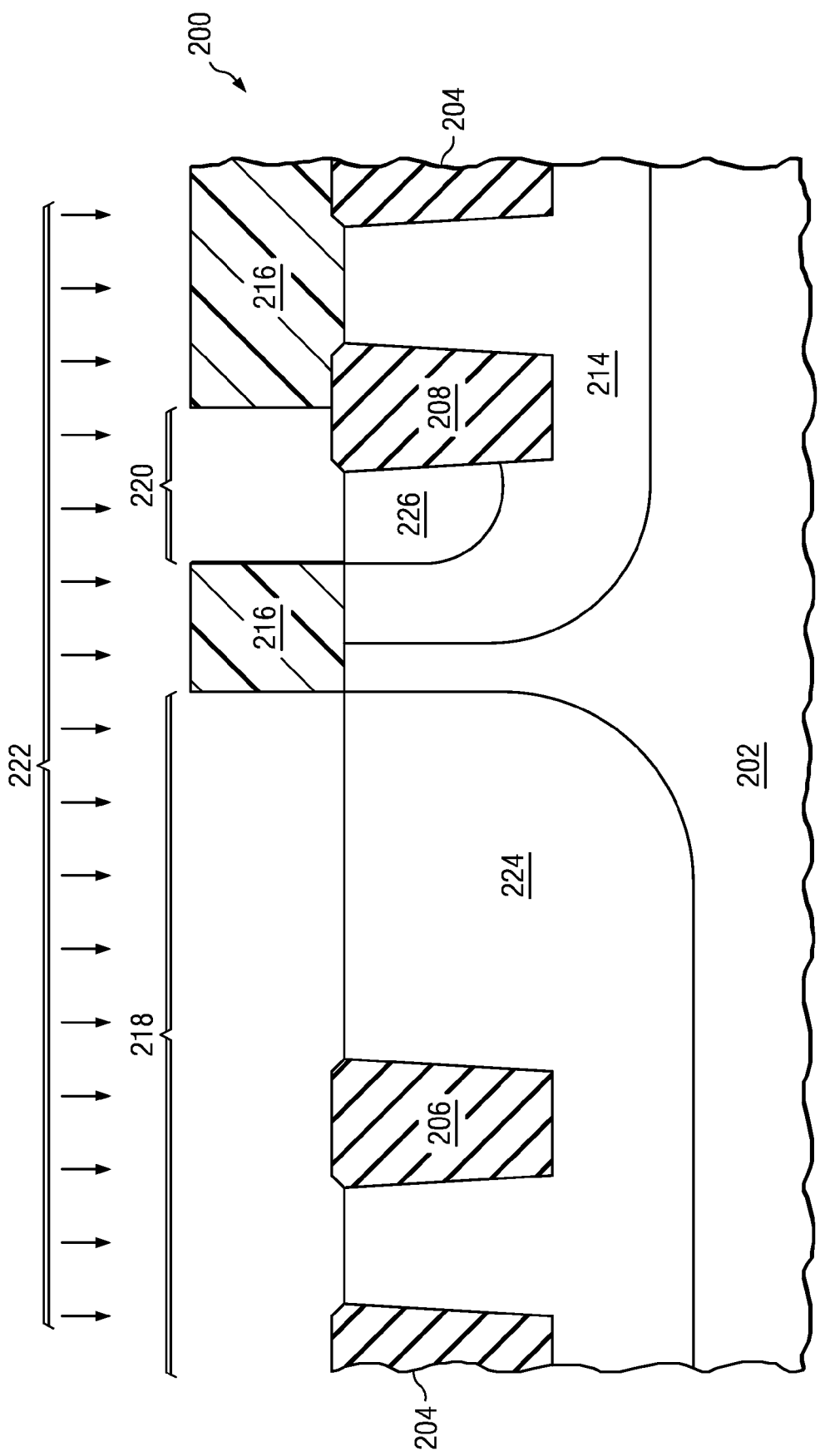
Figure 2C:
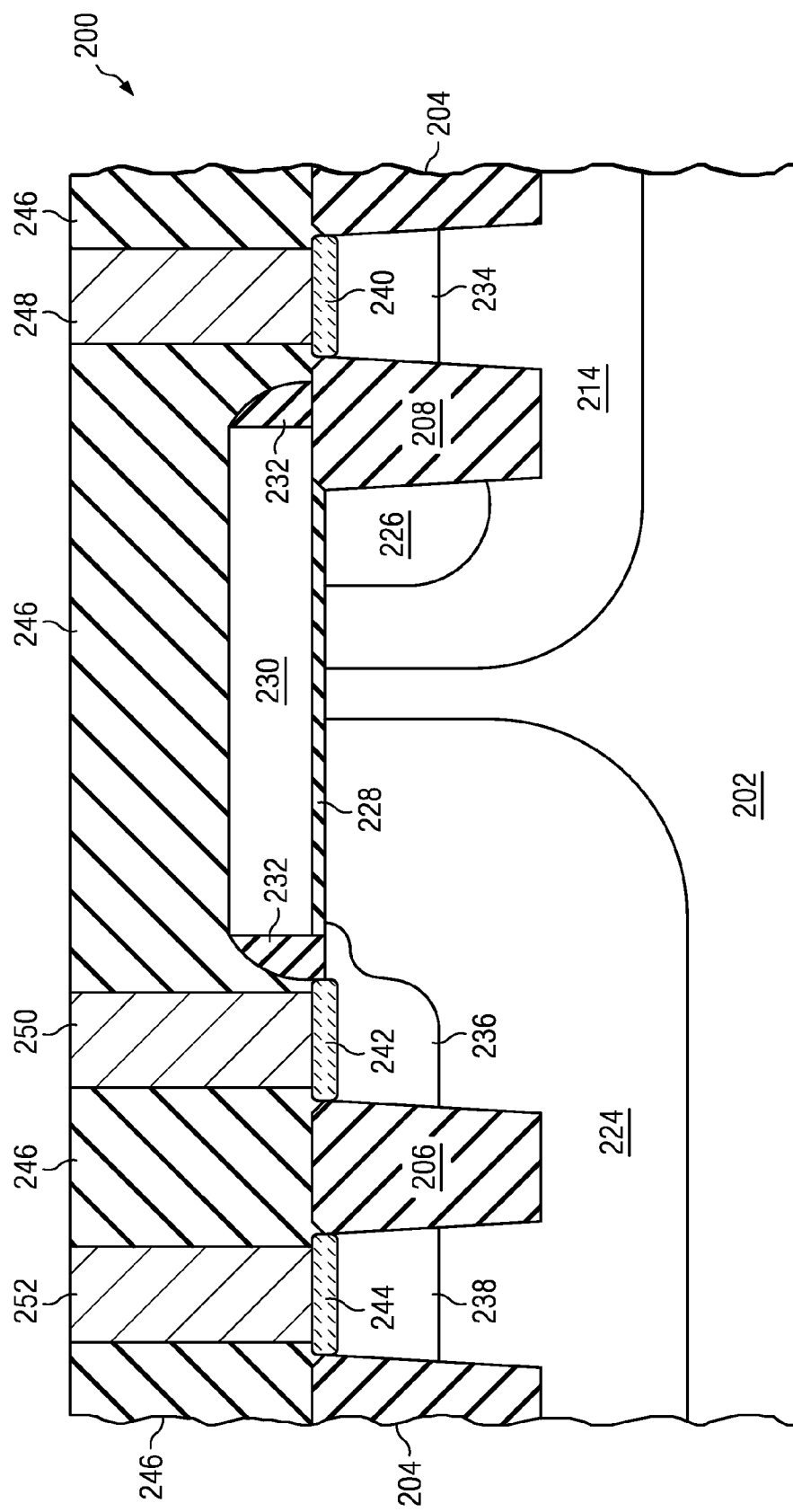

FIG. 2A through FIG. 2C are cross-sections of an IC built on a n-type substrate with a p-channel DEMOS (DEPMOS) transistor formed according to another embodiment of the instant invention. Referring to FIG. 2A, the IC (200) includes a n-type substrate (202), which may be a monolithic single crystal wafer, commonly with an electrical resistivity between 0.5 and 5 ohm-cm, a wafer with a layer of n-type epitaxial single crystal silicon, commonly with an electrical resistivity between 5 and 500 ohm-cm, or any other substrate suitable for fabrication of the IC (200) with a single crystal n-type layer forming a top surface of the substrate (202). Elements of field oxide (204, 106, 108), typically silicon dioxide 250 to 600 nanometers deep, commonly formed by STI, HARP or LOCOS, are formed at a top surface of the substrate (202) to provide lateral electrical isolation between elements of the IC (200) in the substrate (202). Field oxide elements (204) provide lateral electrical isolation between the DEPMOS transistor and other components in the substrate (202). A region is defined for a p-well, commonly known as a p-well, by a p-well photoresist pattern (210) on the top surface of the substrate (202), which is formed by known photolithographic processes. The p-well region includes area in the substrate (202) on both sides of field oxide element (208). A first set of p-type dopants (212), typically boron and less commonly, gallium, are ion implanted into the IC (200), to form the p-well (214). The p-well photoresist pattern (210) blocks the first set of p-type dopants (212) from regions in the substrate (202) not defined for the p-well (214). The ion implantation process to form the p-well (214) typically includes several steps in which p-type dopants are ion implanted at different energies and different doses so as to form a continuous p-type region from the top surface of the substrate (202) to a depth below a bottom surface of the field oxide (208), commonly 400 to 800 nanometers. A typical total dose of the first set of p-type dopants (212) is between $1 \cdot 10^{12}$ cm$^{-2}$ and $1 \cdot 10^{15}$ cm$^{-2}$. A typical maximum ion implant energy for the first set of p-type dopants (212) is between 100 and 600 keV. The p-well photoresist pattern (210) is removed after the p-well ion implantation process, typically by etching the photoresist material in an oxygen containing plasma followed by a wet chemical cleanup of any photoresist residue. The p-well (214) forms a drain of the DEPMOS transistor.

FIG. 2B depicts the IC (200) at a further stage of fabrication. An n-well photoresist pattern (216) is formed on a top surface of the substrate (202) to define an n-well area (218) for an n-well in the substrate (202), and an n-type compensation area (220) for an n-type compensation region in the substrate (102). A first set of n-type dopants (222) typically phosphorus and arsenic, are ion implanted into the IC (200) to form the n-well (224) and an n-type compensation region (226). The n-type compensation region (226) is within the boundaries of the p-well (214) under a region defined for a DEPMOS gate and overlaps the field oxide element (208). Furthermore, the n-type compensation region (226) extends from the top surface of the substrate (202) downward to less than the depth of the field oxide element (208), and does not extend to the n-type region in the substrate (202) below the p-well (214). The n-well photoresist pattern (216) blocks the first set of n-type dopants (222) from regions in the substrate (202) not defined for the n-well region (218) or the n-type compensation region (220). The ion implantation process to form the n-well (224) typically includes several steps in which n-type dopants are ion implanted at different energies and different doses so as to form a continuous n-type region from the top surface of the substrate (202) to a depth below a bottom surface of the field oxide (206), commonly 500 to 1000 nanometers. A typical total dose of the first set of n-type dopants (222) is between $1 \cdot 10^{12}$ cm$^{-2}$ and $1 \cdot 10^{15}$ cm$^{-2}$. A typical maximum ion implant energy for the first set of n-type dopants (222) is between 200 and 900 keV. The n-well photoresist pattern (216) is removed after the n-well ion implantation process, typically by etching the photoresist material in an oxygen containing plasma followed by a wet chemical cleanup of any photoresist residue.

It is within the scope of the instant invention to perform the p-well and n-well ion implantation steps in any order.

FIG. 2C depicts the IC (200) after formation of the inventive DEPMOS transistor is completed. An MOS gate dielectric layer (228), typically silicon dioxide, nitrogen doped silicon dioxide, silicon oxy-nitride, hafnium oxide, layers of silicon dioxide and silicon nitride, or other insulating material, commonly 1 to 5 nanometers thick, is formed on top surfaces of the p-well (214), n-well (224) and substrate (202). A DEMOS gate (230) is formed by depositing a layer of gate material, typically polysilicon, commonly 50 to 200 nanometers thick, on a top surface of the MOS gate dielectric layer (228), defining a region for the DEMOS gate (230) with a photoresist pattern using known photolithographic methods, and removing unwanted gate material by known etching methods. Gate sidewall spacers (232) are formed on lateral surfaces of the DEMOS gate (230) by depositing a layer of silicon nitride or silicon dioxide, or a stack of silicon nitride and silicon dioxide layers, on a top surface and the lateral surfaces of the DEMOS gate (230) and top surfaces of the p-well (214) and n-well (224), followed by an anisotropic etch process which removes the deposited material from the top surfaces of the DEMOS gate (230), p-well (214) and n-well (224).

Still referring to FIG. 2C, an p-type drain contact region (234) and a p-type source contact region (236) are formed by ion implantation of a second set of p-type dopants, typically boron, gallium and/or indium, commonly with a total dose between $1 \cdot 10^{14}$ cm$^{-2}$ and $3 \cdot 10^{16}$ cm$^{-2}$, at energies between 2 and 100 keV. A p-type source-drain photoresist pattern, not shown in FIG. 2C for clarity, defines the p-type drain contact region (234) and p-type source contact region (236) during ion implantation of the second set of p-type dopants. An n-type substrate contact region (238) is formed by ion implantation of a second set of n-type dopants, typically phosphorus, arsenic and/or antimony, commonly with a total dose between $1 \cdot 10^{14}$ cm$^{-2}$ and $3 \cdot 10^{16}$ cm$^{-2}$, at energies between 5 and 200 keV. An n-type source-drain photoresist pattern, not shown in FIG. 2C for clarity, defines the n-type substrate contact region (238) during ion implantation of the second set of n-type dopants.

Continuing to refer to FIG. 2C, metal silicide is formed on the p-type drain contact region (234), p-type source contact region (236) and n-type substrate contact region (238) by depositing a refractory metal, such as titanium, cobalt or nickel, on the top surfaces of the contact regions (234, 136, 138), followed by depositing an optional cap layer over the refractory metal, reacting the refractory metal with silicon in the contact regions during a thermal process to form metal silicide, and removing unreacted refractory metal and cap layer material, to form a drain silicide contact layer (240), a source silicide contact layer (242) and a substrate silicide contact layer (244) on top surfaces of the respective contact regions (234, 136, 138).

Continuing to refer to FIG. 2C, a PMD (246), typically a dielectric layer stack including a silicon nitride or silicon dioxide PMD liner 10 to 100 nanometers thick deposited by PECVD, a layer of silicon dioxide, PSG or BPSG, commonly 100 to 1000 nanometers thick deposited by PECVD, commonly leveled by a CMP process, and an optional PMD cap layer, commonly 10 to 100 nanometers of a hard material such as silicon nitride, silicon carbide nitride or silicon carbide, is formed on top surfaces of the DEMOS gate (230) and the silicide contact layers (240, 142, 144). A drain contact (248), a source contact (250) and a substrate contact (252) are formed in the PMD (246), typically by defining regions for contact holes with a contact photoresist pattern on a top surface of the PMD (246), not shown in FIG. 2C for clarity, removing PMD material in the regions defined by the contact photoresist pattern using known etching methods to expose the silicide contact layers (240, 142, 144), depositing contact metal, typically tungsten, in the contact holes, and selectively removing the contact metal from the top surface of the PMD (246), commonly by known CMP and/or etching processes. A gate contact, not shown in FIG. 2C for clarity, is also formed which connects to the DEMOS gate (230).

During operation of the DEPMOS transistor described by the above embodiment, the source contact (250) and substrate contact (252) are typically connected to potentials within 1 volt of ground potential, and a negative drain potential, typically with a magnitude greater than 4 volts, is applied to the drain contact (248). A portion of the p-well (214) adjacent to the n-type compensation region (226) is depleted, causing a significant fraction of the potential difference between the drain contact (248) and the source contact (250) to occur across the depleted p-well region, resulting in a desirably lower electric field at an interface between the p-well (214) and the MOS gate dielectric layer (228) than would exist in the absence of the n-type compensation region (226). Formation of the n-type compensation region (226) simultaneously with the n-well (224) is advantageous because it provides the benefit of the n-type compensation region without adding fabrication cost or complexity.

In a further embodiment, a second DEPMOS transistor with a second n-type compensation region is formed in the IC (200) in which a width of the second n-type compensation region is different than a width of the n-type compensation region in the first DEPMOS transistor, providing a DEPMOS transistor with a different drain voltage and drive current capability compared to the first DEPMOS transistor. This is advantageous because it provides a capability of optimally handling more than one input and output signal with different voltages in the same IC without adding fabrication cost or complexity.

In a preferred embodiment, the n-type compensation region (226) is connected to a control potential that can vary a depletion width between the n-type compensation region (226) and the p-well (214). This is advantageous because it provides a method of changing a drain voltage and drive current capability of a single DEPMOS transistor, during operation of the IC (200), without adding fabrication cost or complexity.

Figure 3A:
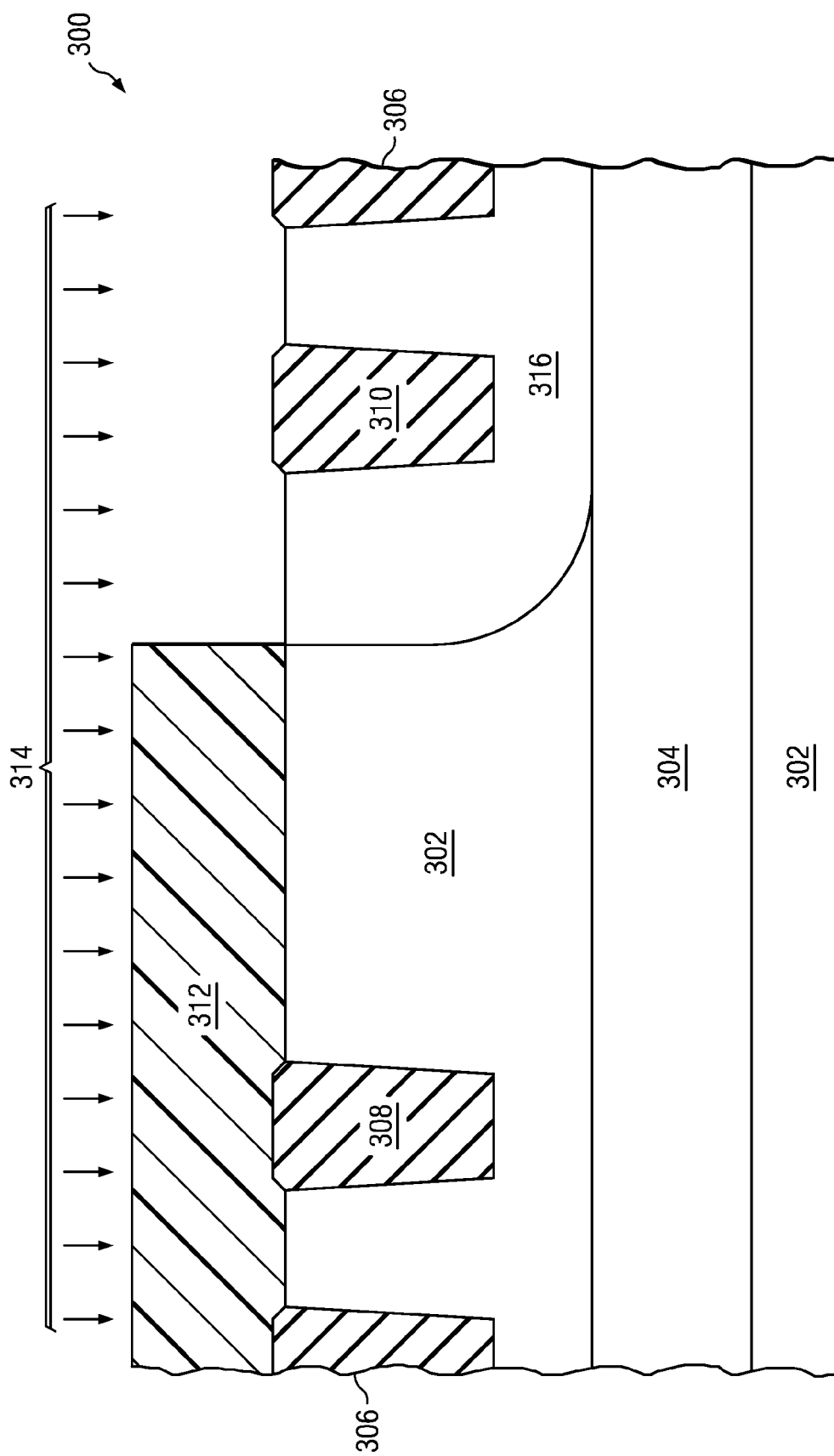
FIG. 3A through FIG. 3C are cross-sections of an IC built on a n-type substrate with a DENMOS transistor formed according to an alternate embodiment of the instant invention.
Figure 3B:
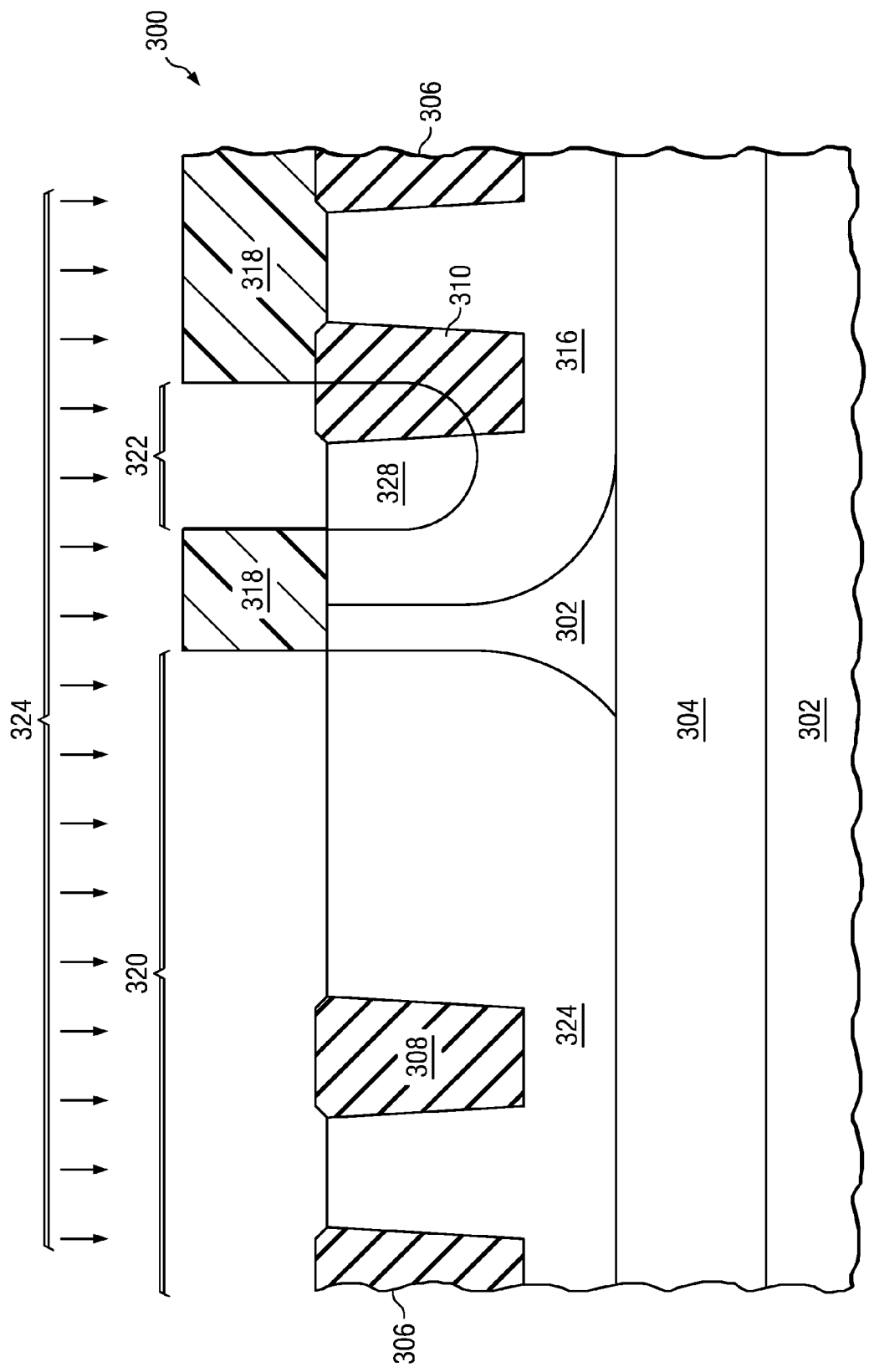
Figure 3C:
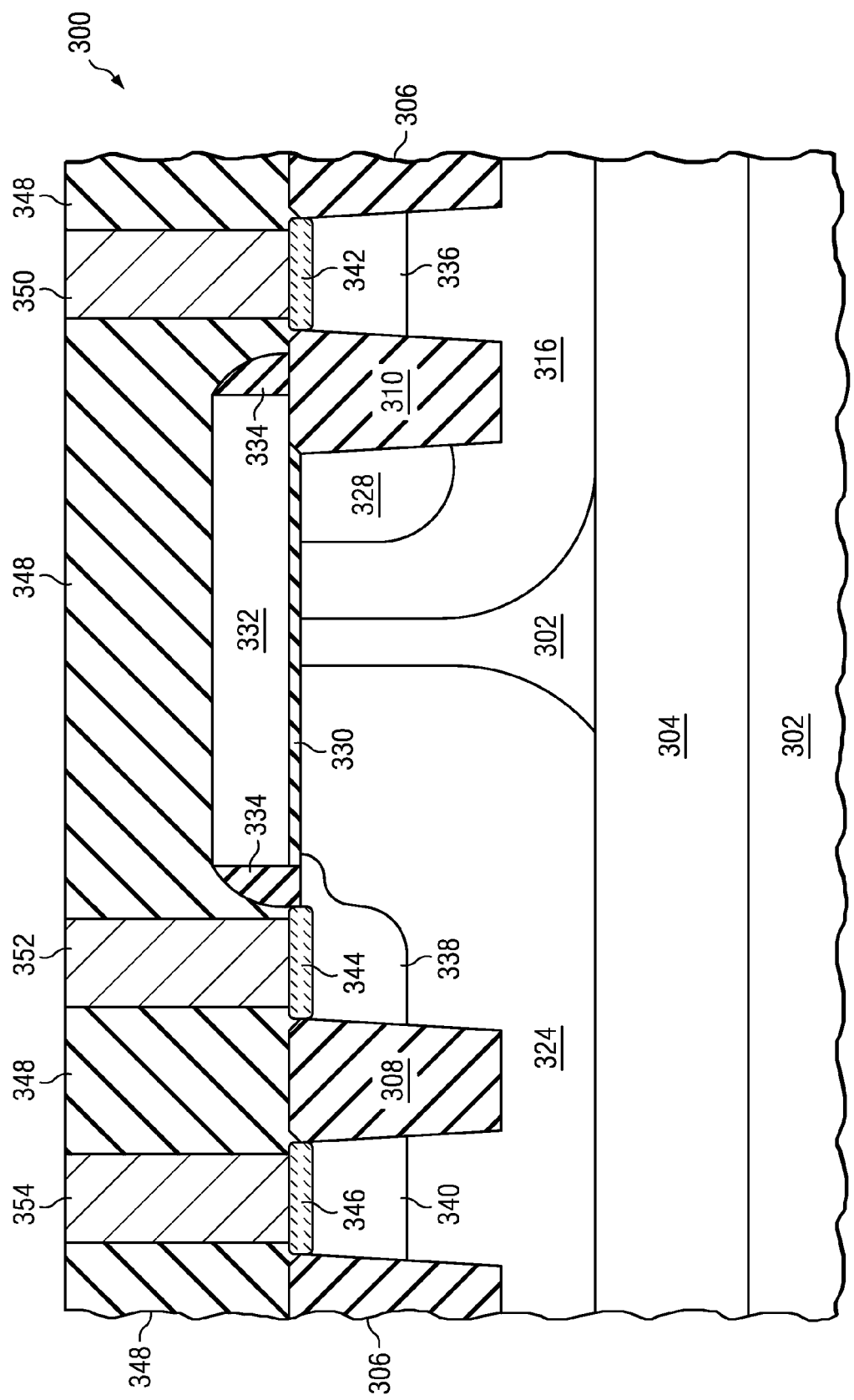

FIG. 3A through FIG. 3C are cross-sections of an IC built on a n-type substrate with a DENMOS transistor formed according to an alternate embodiment of the instant invention. Referring to FIG. 3A, the IC (300) includes an n-type substrate (302), which may be a monolithic single crystal wafer, commonly with an electrical resistivity between 0.5 and 5 ohm-cm, a wafer with a layer of n-type epitaxial single crystal silicon, commonly with an electrical resistivity between 5 and 500 ohm-cm, or any other substrate suitable for fabrication of the IC (300) with a single crystal n-type layer forming a top surface of the substrate (302). A p-type buried layer (304), which is a common element in integrated circuits, and is commonly 100 nanometers to 1 micron thick, with electrical resistivities between 0.001 and 0.1 ohm-cm, is formed in the substrate (302), typically by ion implantation of p-type dopants such as boron or gallium, followed by a thermal anneal, such that a top surface of the p-type buried layer is between 500 nanometers and 1 micron below a top surface of the substrate (302). Elements of field oxide (306, 308, 310), typically silicon dioxide 250 to 600 nanometers deep, commonly formed by STI, HARP or LOCOS, are formed at a top surface of the substrate (302) to provide lateral electrical isolation between elements of the IC (300) in the substrate (302). A bottom surface of the field oxide (306, 308, 310) is more than 100 nanometers above a top surface of the p-type buried layer (304). Field oxide elements (306) provide lateral electrical isolation between the DENMOS transistor and other components in the substrate (302). A region is defined for an n-well, by an n-well photoresist pattern (312) on the top surface of the substrate (302), which is formed by known photolithographic processes. The n-well region includes area in the substrate (302) on both sides of field oxide element (310). A first set of n-type dopants (314), typically phosphorus and/or arsenic, are ion implanted into the IC (300), to form the n-well (316). The n-well photoresist pattern (312) blocks the first set of n-type dopants (314) from regions in the substrate (302) not defined for the n-well (316). The ion implantation process to form the n-well (316) typically includes several steps in which n-type dopants are ion implanted at different energies and different doses so as to form a continuous n-type region from the top surface of the substrate (302) to the top surface of the p-type buried layer (304). A typical total dose of the first set of n-type dopants (314) is between $1 \cdot 10^{12}$ cm$^{-2}$ and $1 \cdot 10^{15}$ cm$^{-2}$. A typical maximum ion implant energy for the first set of n-type dopants (314) is between 200 and 700 keV. The n-well photoresist pattern (312) is removed after the n-well ion implantation process, typically by etching the photoresist material in an oxygen containing plasma followed by a wet chemical cleanup of any photoresist residue. The n-well (316) forms a drain of the DENMOS transistor.

FIG. 3B depicts the IC (300) at a further stage of fabrication. A p-well photoresist pattern (318) is formed on the top surface of the substrate (302) to define a p-well area (320) for a p-well in the substrate (302), and a p-type compensation area (322) for a p-type compensation region in the substrate (302). A first set of p-type dopants (324) typically boron and, less commonly gallium, are ion implanted into the IC (300) to form the p-well (326) and a p-type compensation region (328). The p-type compensation region (328) is within the boundaries of the n-well (316) under a region defined for a DENMOS gate and overlaps the field oxide element (310). Furthermore, the p-type compensation region (328) extends from the top surface of the substrate (302) downward to less than the depth of the field oxide element (310), and does not extend to the p-type buried layer (304) below the n-well (316). The p-well photoresist pattern (318) blocks the first set of p-type dopants (324) from regions in the substrate (302) not defined for the p-well region (320) or the p-type compensation region (322). The ion implantation process to form the p-well (326) typically includes several steps in which p-type dopants are ion implanted at different energies and different doses so as to form a continuous p-type region from the top surface of the substrate (302) to the top surface of the p-type buried layer (304). A typical total dose of the first set of p-type dopants (324) is between $1 \cdot 10^{12}$ cm$^{-2}$ and $1 \cdot 10^{15}$ cm$^{-2}$. A typical maximum ion implant energy for the first set of p-type dopants (324) is between 100 and 600 keV. The p-well photoresist pattern (318) is removed after the p-well ion implantation process, typically by etching the photoresist material in an oxygen containing plasma followed by a wet chemical cleanup of any photoresist residue.

It is within the scope of the instant invention to perform the n-well and p-well ion implantation steps in any order.

FIG. 3C depicts the IC (300) after formation of the inventive DENMOS transistor is completed. An MOS gate dielectric layer (330), typically silicon dioxide, nitrogen doped silicon dioxide, silicon oxy-nitride, hafnium oxide, layers of silicon dioxide and silicon nitride, or other insulating material, commonly 1 to 5 nanometers thick, is formed on top surfaces of the n-well (316), p-well (326) and substrate (302). A DEMOS gate (332) is formed by depositing a layer of gate material, typically polycrystalline silicon, known as polysilicon, commonly 50 to 200 nanometers thick, on a top surface of the MOS gate dielectric layer (330), defining a region for the DEMOS gate (332) with a photoresist pattern using known photolithographic methods, and removing unwanted gate material by known etching methods. Gate sidewall spacers (334) are formed on lateral surfaces of the DEMOS gate (332) by depositing a layer of silicon nitride or silicon dioxide, or a stack of silicon nitride and silicon dioxide layers, on a top surface and the lateral surfaces of the DEMOS gate (332) and top surfaces of the n-well (316) and p-well (326), followed by an anisotropic etch process which removes the deposited material from the top surfaces of the DEMOS gate (332), n-well (316) and p-well (326).

Still referring to FIG. 3C, an n-type drain contact region (336) and an n-type source contact region (338) are formed by ion implantation of a second set of n-type dopants, typically phosphorus, arsenic and/or antimony, commonly with a total dose between $1 \cdot 10^{14}$ cm$^{-2}$ and $3 \cdot 10^{16}$ cm$^{-2}$, at energies between 5 and 200 keV. An n-type source-drain photoresist pattern, not shown in FIG. 3C for clarity, defines the n-type drain contact region (336) and n-type source contact region (338) during ion implantation of the second set of n-type dopants. A p-type substrate contact region (340) is formed by ion implantation of a second set of p-type dopants, typically boron, gallium and/or indium, commonly with a total dose between $1 \cdot 10^{14}$ cm$^{-2}$ and $3 \cdot 10^{16}$ cm$^{-2}$, at energies between 2 and 100 keV. A p-type source-drain photoresist pattern, not shown in FIG. 3C for clarity, defines the p-type substrate contact region (340) during ion implantation of the second set of p-type dopants.

Continuing to refer to FIG. 3C, metal silicide is formed on the n-type drain contact region (336), n-type source contact region (338) and p-type substrate contact region (340) by depositing a refractory metal, such as titanium, cobalt or nickel, on the top surfaces of the contact regions (336, 338, 340), followed by depositing an optional cap layer over the refractory metal, reacting the refractory metal with silicon in the contact regions during a thermal process to form metal silicide, and removing unreacted refractory metal and cap layer material, to form a drain silicide contact layer (342), a source silicide contact layer (344) and a substrate silicide contact layer (346) on top surfaces of the respective contact regions (336, 338, 340).

Continuing to refer to FIG. 3C, a PMD (348), typically a dielectric layer stack including a silicon nitride or silicon dioxide PMD liner 10 to 100 nanometers thick deposited by PECVD, a layer of silicon dioxide, PSG or BPSG, commonly 100 to 1000 nanometers thick deposited by PECVD, commonly leveled by a CMP process, and an optional PMD cap layer, commonly 10 to 100 nanometers of a hard material such as silicon nitride, silicon carbide nitride or silicon carbide, is formed on top surfaces of the DEMOS gate (332) and the silicide contact layers (344, 344, 346). A drain contact (350), a source contact (352) and a substrate contact (354) are formed in the PMD (348), typically by defining regions for contact holes with a contact photoresist pattern on a top surface of the PMD (348), not shown in FIG. 3C for clarity, removing PMD material in the regions defined by the contact photoresist pattern using known etching methods to expose the silicide contact layers (344, 344, 346), depositing contact metal, typically tungsten, in the contact holes, and selectively removing the contact metal from the top surface of the PMD (348), commonly by known CMP and/or etching processes. A gate contact, not shown in FIG. 3C for clarity, is also formed which connects to the DEMOS gate (332).

During operation of the DENMOS transistor described by the above embodiment, the source contact (352) and substrate contact (354) are typically connected to potentials within 1 volt of ground potential, and a positive drain potential, typically greater than 4 volts, is applied to the drain contact (350). A portion of the n-well (316) adjacent to the p-type compensation region (328) is depleted, causing a significant fraction of the potential difference between the drain contact (350) and the source contact (352) to occur across the depleted n-well region, resulting in a desirably lower electric field at an interface between the n-well (316) and the MOS gate dielectric layer (330) than would exist in the absence of the p-type compensation region (328). Formation of the p-type compensation region (328) simultaneously with the p-well (326) is advantageous because it provides the benefit of the p-type compensation region without adding fabrication cost or complexity.

In a further embodiment, a second DENMOS transistor with a second p-type compensation region is formed in the IC (300) in which a width of the second p-type compensation region is different than a width of the p-type compensation region in the first DENMOS transistor, providing a DENMOS transistor with a different drain voltage and drive current capability compared to the first DENMOS transistor. This is advantageous because it provides a capability of optimally handling more than one input and output signal with different voltages in the same IC without adding fabrication cost or complexity.

In a preferred embodiment, the p-type compensation region (328) is connected to a control potential that can vary a depletion width between the p-type compensation region (328) and the n-well (316). This is advantageous because it provides a method of changing a drain voltage and drive current capability of a single DENMOS transistor, during operation of the IC (300), without adding fabrication cost or complexity.

Figure 4A:
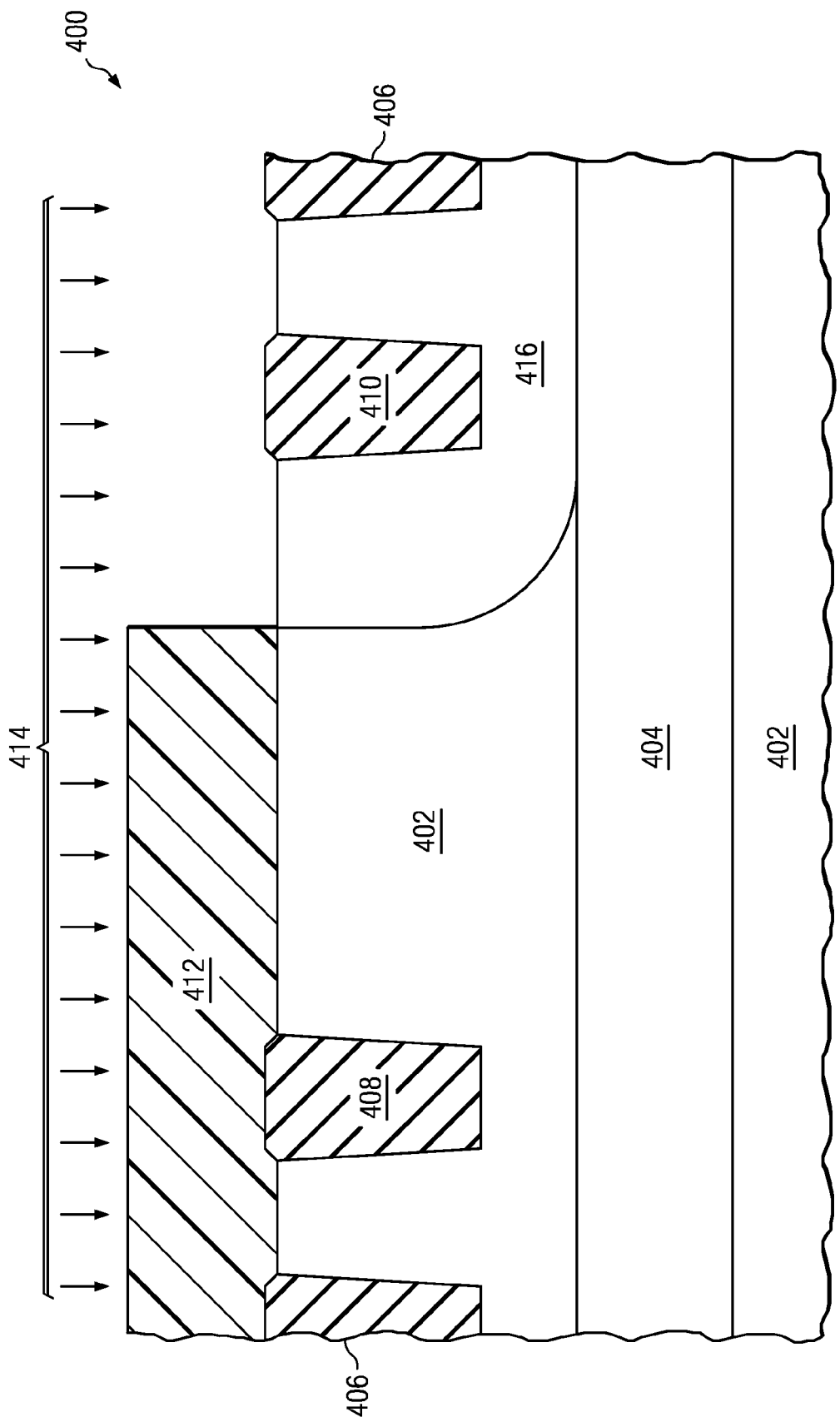
FIG. 4A through FIG. 4C are cross-sections of an IC built on a p-type substrate with a DEPMOS transistor formed according to a further embodiment of the instant invention.
Figure 4B:
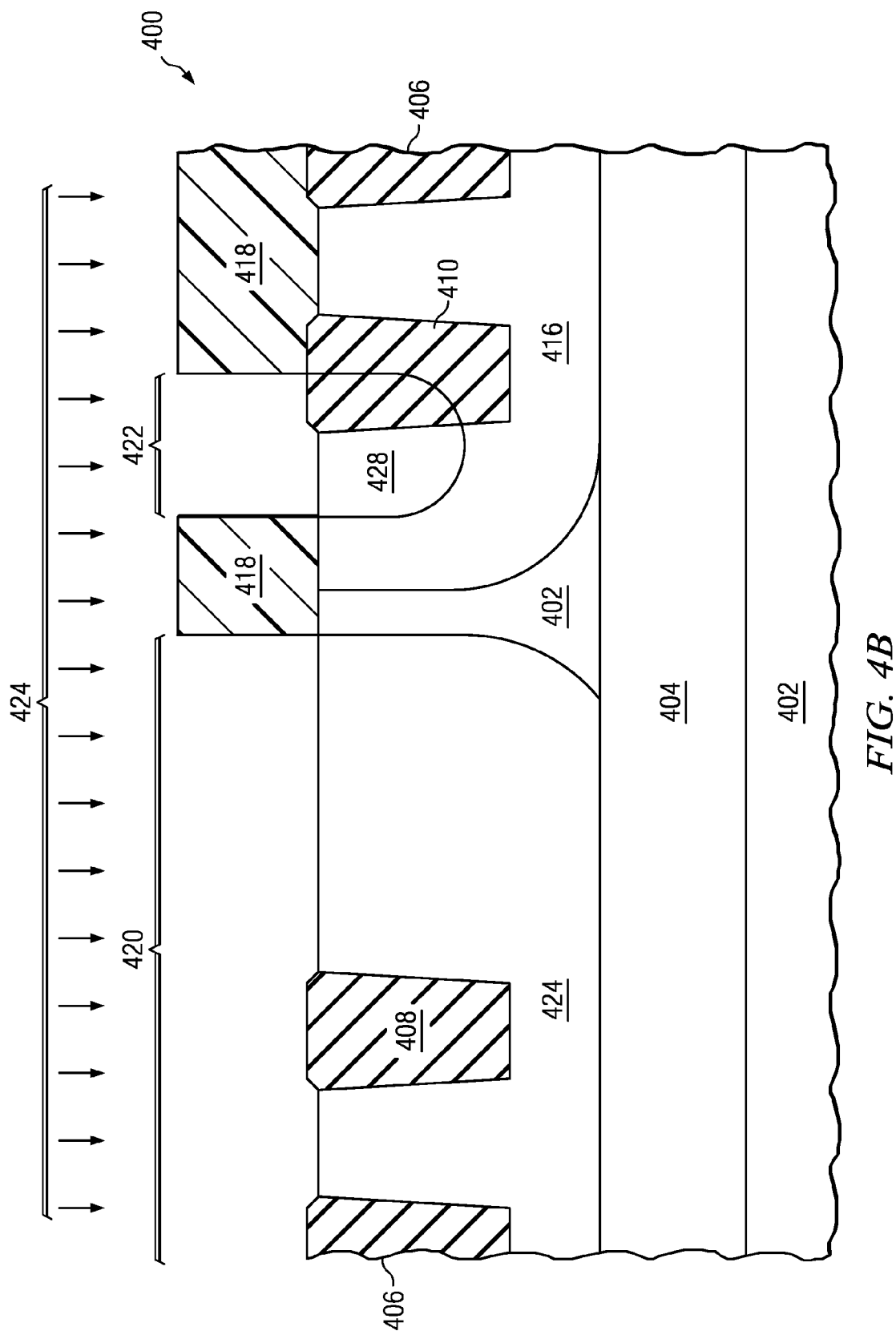
Figure 4C:
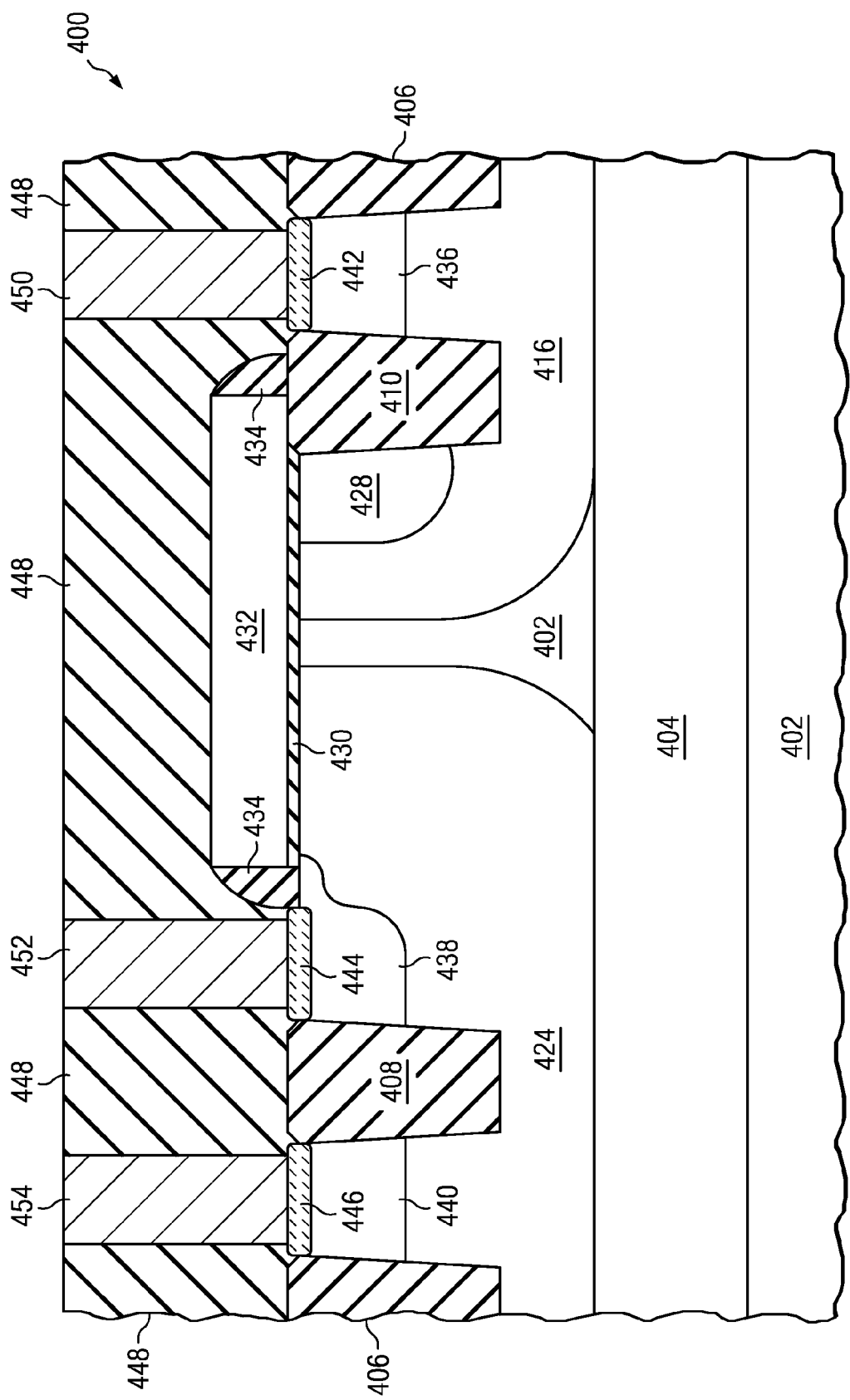

FIG. 4A through FIG. 4C are cross-sections of an IC built on a p-type substrate with a DEPMOS transistor formed according to a further embodiment of the instant invention. Referring to FIG. 4A, the IC (400) includes a p-type substrate (402), which may be a monolithic single crystal wafer, commonly with an electrical resistivity between 0.5 and 5 ohm-cm, a wafer with a layer of p-type epitaxial single crystal silicon, commonly with an electrical resistivity between 5 and 500 ohm-cm, or any other substrate suitable for fabrication of the IC (400) with a single crystal p-type layer forming a top surface of the substrate (402). An n-type buried layer (404), which is a common element in integrated circuits, and is commonly 100 nanometers to 1 micron thick, with electrical resistivities between 0.001 and 0.1 ohm-cm, is formed in the substrate (402), typically by ion implantation of n-type dopants such as boron or gallium, followed by a thermal anneal, such that a top surface of the n-type buried layer is between 500 nanometers and 1 micron below a top surface of the substrate (402). Elements of field oxide (406, 408, 410), typically silicon dioxide 250 to 600 nanometers deep, commonly formed by STI, HARP or LOCOS, are formed at a top surface of the substrate (402) to provide lateral electrical isolation between elements of the IC (400) in the substrate (402). A bottom surface of the field oxide (406, 408, 410) is more than 100 nanometers above a top surface of the n-type buried layer (404). Field oxide elements (406) provide lateral electrical isolation between the DEPMOS transistor and other components in the substrate (402). A region is defined for a p-well, by a p-well photoresist pattern (412) on the top surface of the substrate (402), which is formed by known photolithographic processes. The p-well region includes area in the substrate (402) on both sides of field oxide element (410). A first set of p-type dopants (414), typically boron and, less commonly gallium, are ion implanted into the IC (400), to form the p-well (416). The p-well photoresist pattern (412) blocks the first set of p-type dopants (414) from regions in the substrate (402) not defined for the p-well (416). The ion implantation process to form the p-well (416) typically includes several steps in which p-type dopants are ion implanted at different energies and different doses so as to form a continuous p-type region from the top surface of the substrate (402) to the top surface of the n-type buried layer (404). A typical total dose of the first set of p-type dopants (414) is between $1 \cdot 10^{12}$ cm$^{-2}$ and $1 \cdot 10^{15}$ cm$^{-2}$. A typical maximum ion implant energy for the first set of p-type dopants (414) is between 100 and 600 keV. The p-well photoresist pattern (412) is removed after the p-well ion implantation process, typically by etching the photoresist material in an oxygen containing plasma followed by a wet chemical cleanup of any photoresist residue. The p-well (416) forms a drain of the DEPMOS transistor.

FIG. 4B depicts the IC (400) at a further stage of fabrication. An n-well photoresist pattern (418) is formed on the top surface of the substrate (402) to define an n-well area (420) for a n-well in the substrate (402), and an n-type compensation area (422) for an n-type compensation region in the substrate (402). A first set of n-type dopants (424) typically phosphorus and arsenic, are ion implanted into the IC (400) to form the n-well (426) and an n-type compensation region (428). The n-type compensation region (428) is within the boundaries of the p-well (416) under a region defined for a DEPMOS gate and overlaps the field oxide element (410). Furthermore, the n-type compensation region (428) extends from the top surface of the substrate (402) downward to less than the depth of the field oxide element (410), and does not extend to the n-type buried layer (404) below the p-well (416). The n-well photoresist pattern (418) blocks the first set of n-type dopants (424) from regions in the substrate (402) not defined for the n-well region (420) or the n-type compensation region (422). The ion implantation process to form the n-well (426) typically includes several steps in which n-type dopants are ion implanted at different energies and different doses so as to form a continuous n-type region from the top surface of the substrate (402) to the top surface of the n-type buried layer (404). A typical total dose of the first set of n-type dopants (424) is between $1 \cdot 10^{12}$ cm$^{-2}$ and $1 \cdot 10^{15}$ cm$^{-2}$. A typical maximum ion implant energy for the first set of n-type dopants (424) is between 200 and 700 keV. The n-well photoresist pattern (418) is removed after the n-well ion implantation process, typically by etching the photoresist material in an oxygen containing plasma followed by a wet chemical cleanup of any photoresist residue.

It is within the scope of the instant invention to perform the p-well and n-well ion implantation steps in any order.

FIG. 4C depicts the IC (400) after formation of the inventive DEPMOS transistor is completed. An MOS gate dielectric layer (430), typically silicon dioxide, nitrogen doped silicon dioxide, silicon oxy-nitride, hafnium oxide, layers of silicon dioxide and silicon nitride, or other insulating material, commonly 1 to 5 nanometers thick, is formed on top surfaces of the p-well (416), n-well (426) and substrate (402). A DEMOS gate (432) is formed by depositing a layer of gate material, typically polycrystalline silicon, known as polysilicon, commonly 50 to 200 nanometers thick, on a top surface of the MOS gate dielectric layer (430), defining a region for the DEMOS gate (432) with a photoresist pattern using known photolithographic methods, and removing unwanted gate material by known etching methods. Gate sidewall spacers (434) are formed on lateral surfaces of the DEMOS gate (432) by depositing a layer of silicon nitride or silicon dioxide, or a stack of silicon nitride and silicon dioxide layers, followed by an anisotropic etch process.

Still referring to FIG. 4C, an p-type drain contact region (436) and a p-type source contact region (438) are formed by ion implantation of a second set of p-type dopants, typically boron, gallium and/or indium, commonly with a total dose between $1 \cdot 10^{14}$ cm$^{-2}$ and $3 \cdot 10^{16}$ cm$^{-2}$, at energies between 2 and 100 keV. A p-type source-drain photoresist pattern, not shown in FIG. 4C for clarity, defines the p-type drain contact region (436) and p-type source contact region (438) during ion implantation of the second set of p-type dopants. An n-type substrate contact region (440) is formed by ion implantation of a second set of n-type dopants, typically phosphorus, arsenic and/or antimony, commonly with a total dose between $1 \cdot 10^{14}$ cm$^{-2}$ and $3 \cdot 10^{16}$ cm$^{-2}$, at energies between 5 and 200 keV. An n-type source-drain photoresist pattern, not shown in FIG. 4C for clarity, defines the n-type substrate contact region (440) during ion implantation of the second set of n-type dopants.

Continuing to refer to FIG. 4C, metal silicide is formed on the p-type drain contact region (436), p-type source contact region (438) and n-type substrate contact region (440) by depositing a refractory metal, such as titanium, cobalt or nickel, on the top surfaces of the contact regions (436, 338, 340), followed by depositing an optional cap layer over the refractory metal, reacting the refractory metal with silicon in the contact regions during a thermal process to form metal silicide, and removing unreacted refractory metal and cap layer material, to form a drain silicide contact layer (442), a source silicide contact layer (444) and a substrate silicide contact layer (446) on top surfaces of the respective contact regions (436, 438, 440).

Continuing to refer to FIG. 4C, a PMD (448), typically a dielectric layer stack including a silicon nitride or silicon dioxide PMD liner 10 to 100 nanometers thick deposited by PECVD, a layer of silicon dioxide, PSG or BPSG, commonly 100 to 1000 nanometers thick deposited by PECVD, commonly leveled by a CMP process, and an optional PMD cap layer, commonly 10 to 100 nanometers of a hard material such as silicon nitride, silicon carbide nitride or silicon carbide, is formed on top surfaces of the DEMOS gate (432) and the silicide contact layers (444, 444, 446). A drain contact (450), a source contact (452) and a substrate contact (454) are formed in the PMD (448), typically by defining regions for contact holes with a contact photoresist pattern on a top surface of the PMD (448), not shown in FIG. 4C for clarity, removing PMD material in the regions defined by the contact photoresist pattern using known etching methods to expose the silicide contact layers (444, 444, 446), depositing contact metal, typically tungsten, in the contact holes, and selectively removing the contact metal from the top surface of the PMD (448), commonly by known CMP and/or etching processes. A gate contact, not shown in FIG. 4C for clarity, is also formed which connects to the DEMOS gate (432).

During operation of the DEPMOS transistor described by the above embodiment, the source contact (452) and substrate contact (454) are typically connected to potentials within 1 volt of ground potential, and a positive drain potential, typically greater than 4 volts, is applied to the drain contact (450). A portion of the p-well (416) adjacent to the n-type compensation region (428) is depleted, causing a significant fraction of the potential difference between the drain contact (450) and the source contact (452) to occur across the depleted p-well region, resulting in a desirably lower electric field at an interface between the p-well (416) and the MOS gate dielectric layer (430) than would exist in the absence of the n-type compensation region (428). Formation of the n-type compensation region (428) simultaneously with the n-well (426) is advantageous because it provides the benefit of the n-type compensation region without adding fabrication cost or complexity.

In a further embodiment, a second DEPMOS transistor with a second n-type compensation region is formed in the IC (400) in which a width of the second n-type compensation region is different than a width of the n-type compensation region in the first DEPMOS transistor, providing a DEPMOS transistor with a different drain voltage and drive current capability compared to the first DEPMOS transistor. This is advantageous because it provides a capability of optimally handling more than one input and output signal with different voltages in the same IC without adding fabrication cost or complexity.

In a preferred embodiment, the n-type compensation region (428) is connected to a control potential that can vary a depletion width between the n-type compensation region (428) and the p-well (416). This is advantageous because it provides a method of changing a drain voltage and drive current capability of a single DEPMOS transistor, during operation of the IC (400), without adding fabrication cost or complexity.

Figure 5A:
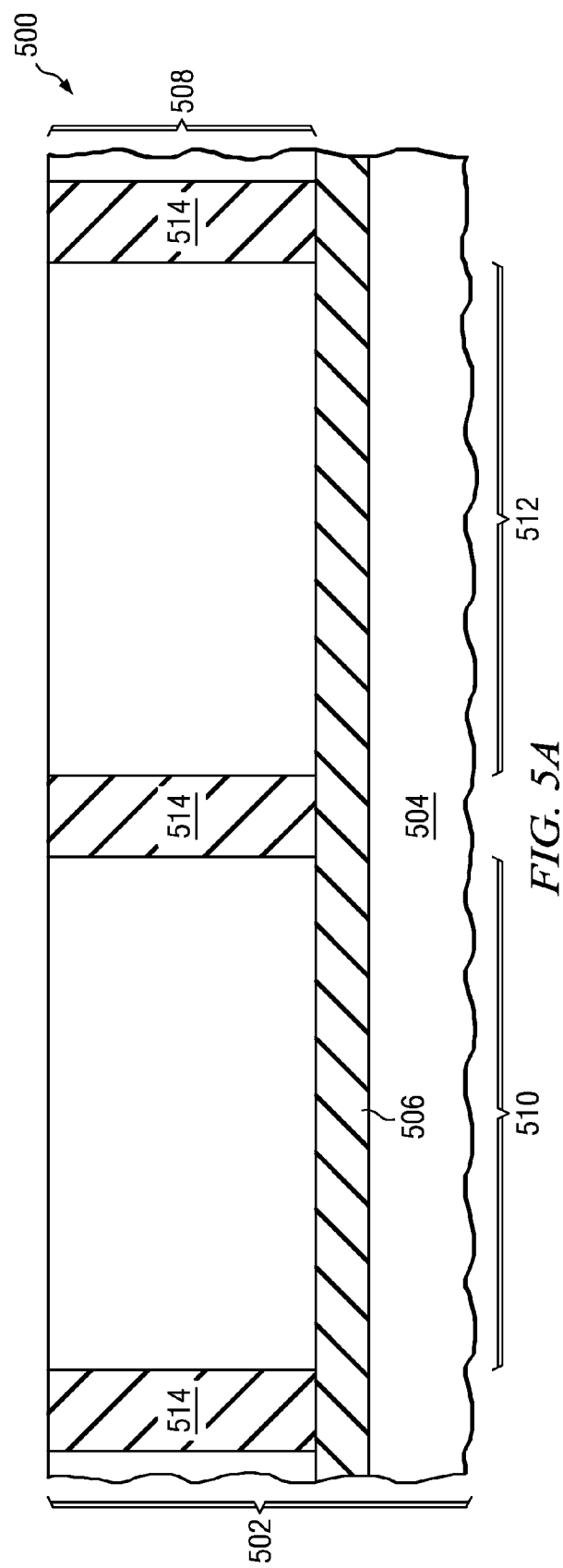
FIG. 5A through FIG. 5D are cross-sections of an IC built on a silicon-on-insulator (SOI) substrate with a DENMOS and a DEPMOS transistor formed according to another embodiment of the instant invention.
Figure 5B:
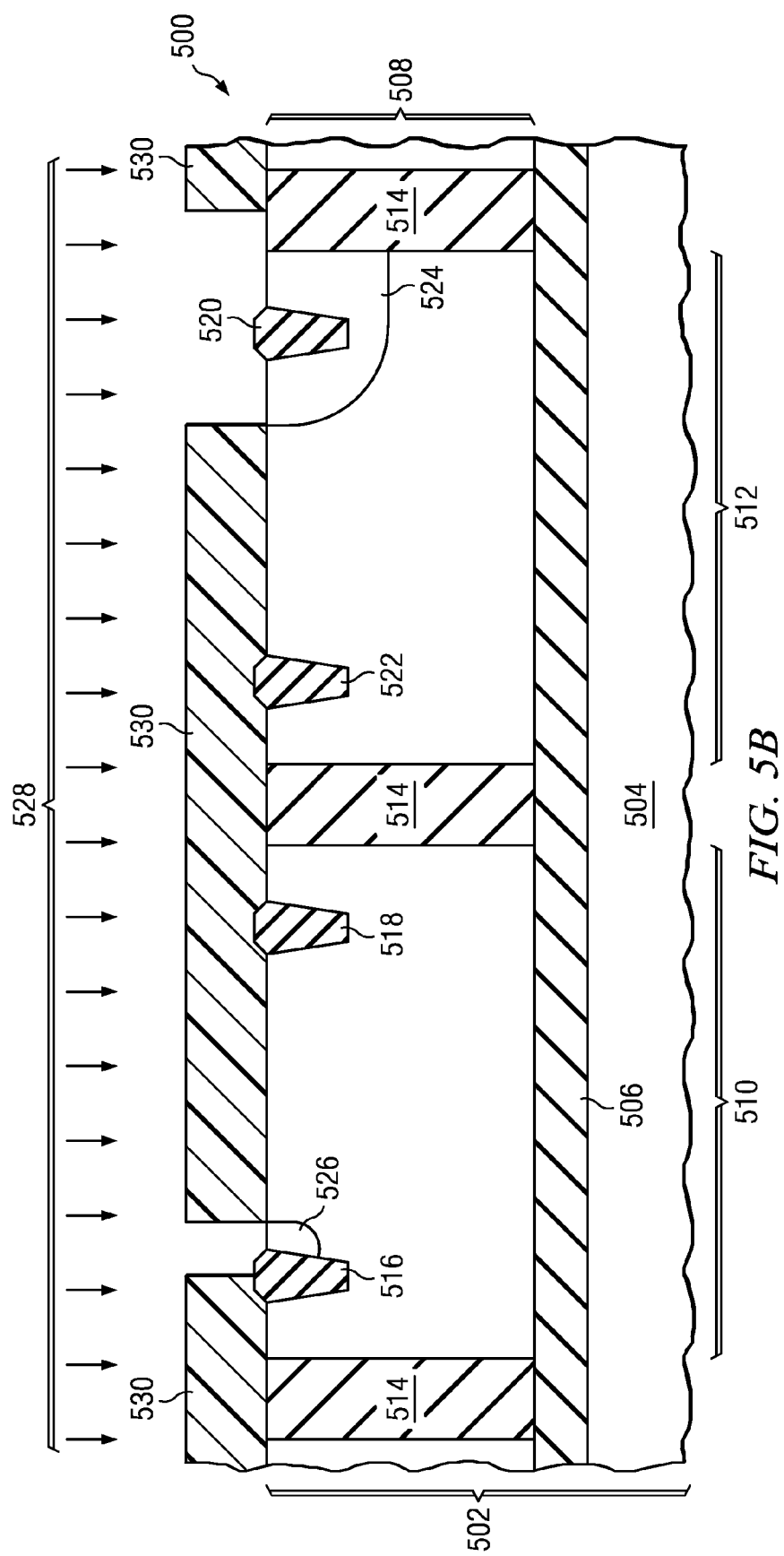
Figure 5C:
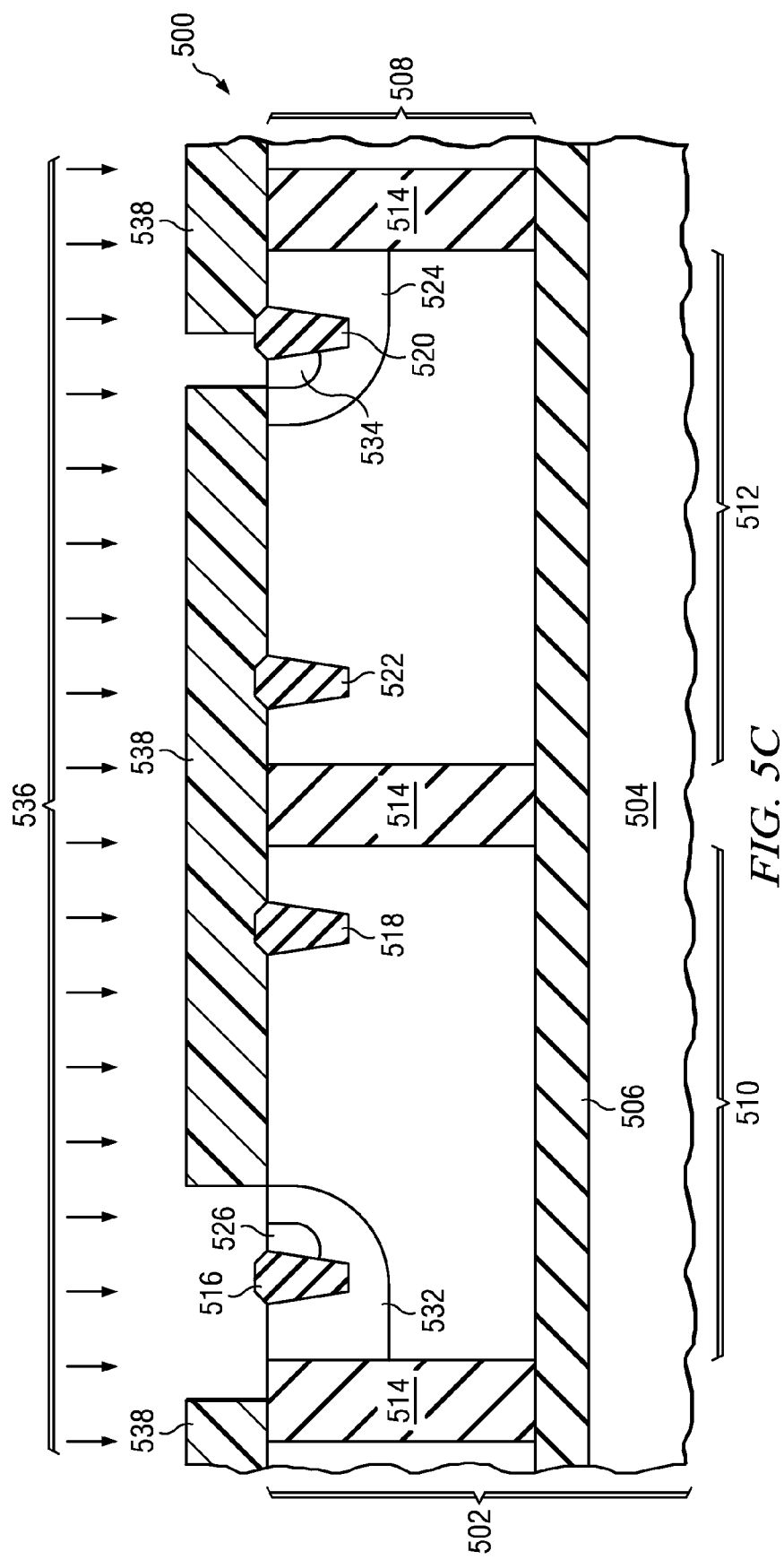

FIG. 5A through FIG. 5C are cross-sections of an IC built on a silicon-on-insulator (SOI) substrate with a DENMOS and a DEPMOS transistor formed according to another embodiment of the instant invention. Referring to FIG. 5A, the IC (500) is fabricated on a commercially available starting wafer (502), which includes a support wafer (504) which is commonly single crystal p-type silicon with an electrical resistivity above 50 ohm-cm, a buried oxide layer (506) which is typically silicon dioxide between 0.1 and 2 microns thick, formed on a top surface of the support wafer (504), and a single crystal silicon-on-insulator (SOI) film (508), typically silicon, commonly 50 nanometers to 10 microns thick, with an electrical resistivity between 1 and 100 ohm-cm, formed on a top surface of the buried oxide layer (506). It is a common practice to remove a portion of the SOI film by etching prior to forming components in the IC (500). It is also a common practice to grow more single crystal silicon or silicon-germanium on a top surface of the single crystal SOI film (508) by epitaxial processes before forming components of the IC (500). The SOI film (508) in a DENMOS region (510) of the IC (500) is ion implanted with a first set of p-type dopants, typically boron, followed by an anneal process such that the first set of p-type dopants are distributed and activated throughout the SOI film (508) in the DENMOS region (510). A dose of the first set of p-type dopants is such that the SOI film (508) in the DENMOS region (510) is p-type and has an electrical resistivity of 1 to 10 ohm-cm. Similarly, the SOI film (508) in a DEPMOS region (512) of the IC (500) is ion implanted with a first set of n-type dopants, typically phosphorus, followed by an anneal process such that the first set of n-type dopants are distributed and activated throughout the SOI film (508) in the DEPMOS region (512). A dose of the first set of n-type dopants is such that the SOI film (508) in the DEPMOS region (512) is n-type and has an electrical resistivity of 1 to 10 ohm-cm.

Still referring to FIG. 5A, regions of deep trench isolation (514) are formed in the SOI film (508) to electrically isolate the DENMOS region (510) and the DEPMOS region (512). The deep trench isolation (514) is typically formed by defining regions for the deep trench isolation with a photoresist pattern on a top surface of the SOI film (508) which exposes the deep trench isolation regions, removing material from the SOI film in the deep trench isolation regions by known etching methods to expose the buried oxide layer (506), and filling the deep trench isolation regions with silicon dioxide or other insulating material.

FIG. 5B depicts the IC (500) at a further stage of fabrication. Elements of field oxide are formed in the DENMOS region (510) and the DEPMOS region (512), extending from the top surface of the SOI film (508) to a depth of 250 to 600 nanometers in the SOI film (508). Field oxide is typically formed by STI, HARP or LOCOS, and includes silicon dioxide to provide the desired electrical isolation. A DENMOS drain field oxide element (516) and a DENMOS source field oxide element (518) are formed in the DENMOS region (510), and a DEPMOS drain field oxide element (520) and a DEPMOS source field oxide element (522) are formed in the DEPMOS region (512).

Still referring to FIG. 5B, a p-well drain (524) is formed in the DEPMOS region (512) and a p-type compensation region (526) is formed in the DENMOS region (510) by ion implantation of a second set of p-type dopants (528) typically boron and, less commonly gallium into the SOI film (508) through a p-well photoresist pattern (530). The p-type compensation region (526) is under a region defined for a DENMOS gate and overlaps the DENMOS drain field oxide element (516). Furthermore, the p-type compensation region (526) extends from the top surface of the SOI film (508) downward to less than the depth of the DENMOS drain field oxide element (516). The p-well photoresist pattern (530) blocks the second set of p-type dopants (528) from regions in the SOI film (508) not defined for the p-well (524) or the p-type compensation region (526). The ion implantation process to form the p-well (524) typically includes several steps in which p-type dopants are ion implanted at different energies and different doses so as to form a continuous p-type region from the top surface of the SOI film (508) to a depth below a bottom surface of the DENMOS drain field oxide element (516), commonly 500 to 1000 nanometers. A typical total dose of the second set of p-type dopants (528) is between $1 \cdot 10^{12}$ cm$^{-2}$ and $1 \cdot 10^{15}$ cm$^{-2}$. A typical maximum ion implant energy for the second set of p-type dopants (528) is between 100 and 600 keV. The p-well photoresist pattern (530) is removed after the p-well ion implantation process, typically by etching the photoresist material in an oxygen containing plasma followed by a wet chemical cleanup of any photoresist residue. The p-well (524) forms a drain of the DEPMOS transistor.

In another embodiment, a second p-well may be formed in the DENMOS region (510) in a region defined for a source and channel of the DENMOS transistor.

FIG. 5C depicts the IC (500) during formation of an n-well drain (532) in the DENMOS region (510) and an n-type compensation region (534) in the DEPMOS region (512) by ion implantation of a second set of n-type dopants (536) typically phosphorus and arsenic into the SOI film (508) through an n-well photoresist pattern (538). The n-type compensation region (534) is under a region defined for a DEPMOS gate and overlaps the DEPMOS drain field oxide element (520). Furthermore, the n-type compensation region (534) extends from the top surface of the SOI film (508) downward to less than the depth of the DEPMOS drain field oxide element (520). The n-well photoresist pattern (538) blocks the second set of n-type dopants (536) from regions in the SOI film (508) not defined for the n-well (532) or the n-type compensation region (534). The ion implantation process to form the n-well (532) typically includes several steps in which n-type dopants are ion implanted at different energies and different doses so as to form a continuous p-type region from the top surface of the SOI film (508) to a depth below a bottom surface of the DEPMOS drain field oxide element (520), commonly 500 to 1000 nanometers. A typical total dose of the second set of n-type dopants (528) is between $1 \cdot 10^{12}$ cm$^{-2}$ and $1 \cdot 10^{15}$ cm$^{-2}$. A typical maximum ion implant energy for the second set of n-type dopants (536) is between 200 and 700 keV. The n-well photoresist pattern (538) is removed after the n-well ion implantation process, typically by etching the photoresist material in an oxygen containing plasma followed by a wet chemical cleanup of any photoresist residue. The n-well (532) forms a drain of the DENMOS transistor.

In another embodiment, a second n-well may be formed in the DEPMOS region (512) in a region defined for a source and channel of the DEPMOS transistor.

It is within the scope of the instant invention to perform the p-well and n-well ion implantation steps in any order.

Figure 5D:
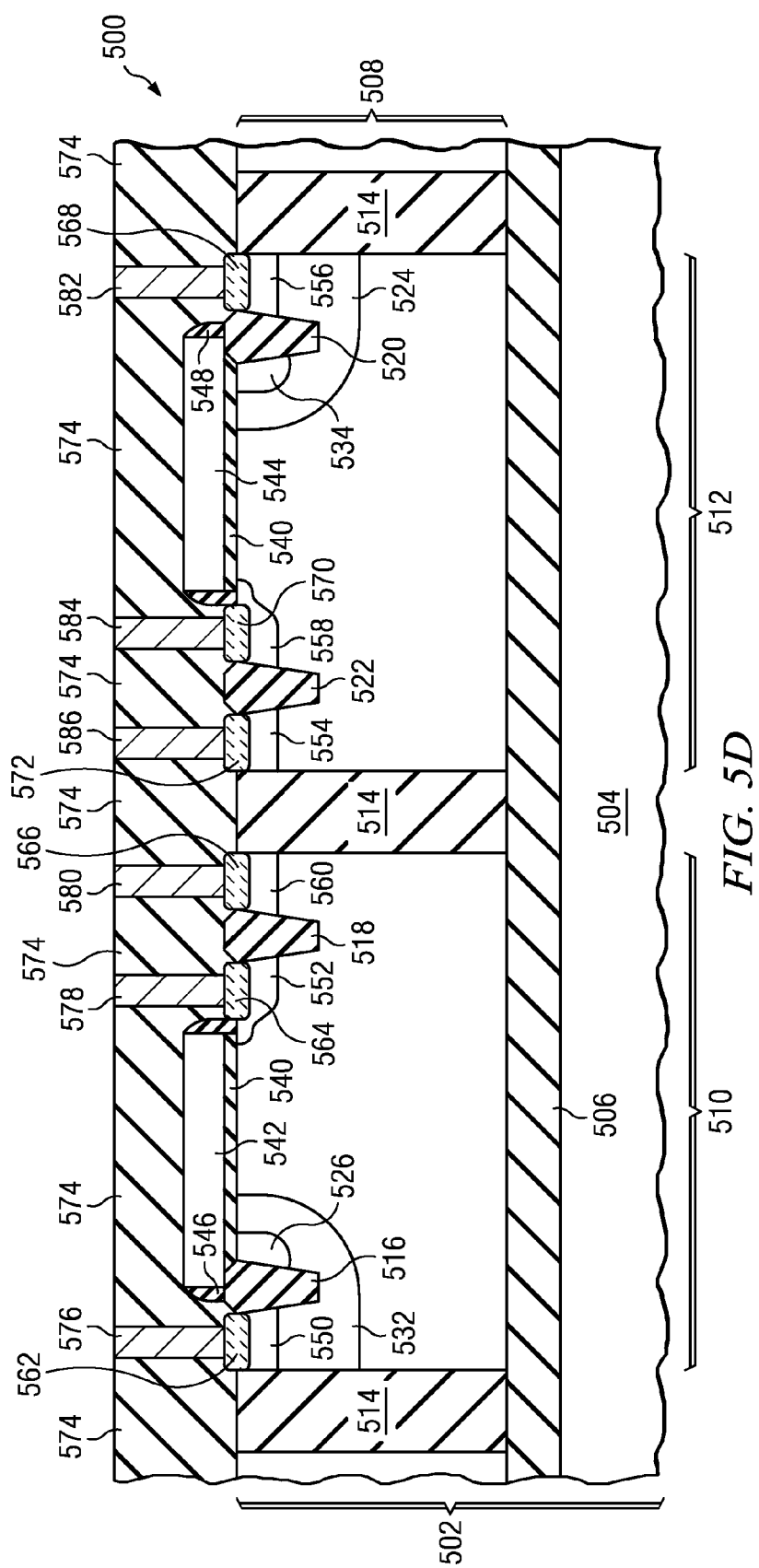

FIG. 5D depicts the IC (500) after formation of the inventive DENMOS and DEPMOS transistors are complete. A metal oxide semiconductor (MOS) gate dielectric layer (540), typically silicon dioxide, nitrogen doped silicon dioxide, silicon oxy-nitride, hafnium oxide, layers of silicon dioxide and silicon nitride, or other insulating material, commonly 1 to 5 nanometers thick, is formed on top surfaces of the SOI film (508). A DENMOS gate (542) and a DEPMOS gate (544) are formed by depositing a layer of gate material, typically polycrystalline silicon, known as polysilicon, commonly 50 to 200 nanometers thick, on a top surface of the MOS gate dielectric layer (540), defining a region for the DENMOS gate (542) and a region for the a DEPMOS gate (544) with a photoresist pattern using known photolithographic methods, and removing unwanted gate material by known etching methods. DENMOS gate sidewall spacers (546) and DEPMOS gate sidewall spacers (548) are formed on lateral surfaces of the DENMOS gate (542) and DEPMOS gate (544) by depositing a layer of silicon nitride or silicon dioxide, or a stack of silicon nitride and silicon dioxide layers, on top surfaces and lateral surfaces of the DENMOS gate (542) and DEPMOS gate (544) and the top surface SOI film (508), followed by an anisotropic etch process which removes the deposited material from the top surfaces of the DENMOS gate (542) and DEPMOS gate (544) and SOI film (508).

Still referring to FIG. 5D, an n-type drain contact region (550) and an n-type source contact region (552) in the DENMOS region (510) and an n-type substrate contact region (554) in the DEPMOS region (512) are formed by ion implantation of a third set of n-type dopants, typically phosphorus, arsenic and/or antimony, commonly with a total dose between $1 \cdot 10^{14}$ cm$^{-2}$ and $3 \cdot 10^{16}$ cm$^{-2}$, at energies between 5 and 200 keV. An n-type source-drain photoresist pattern, not shown in FIG. 5D for clarity, defines the n-type appropriate regions during ion implantation of the third set of n-type dopants. A p-type drain contact region (556) and a p-type source contact region (558) in the DEPMOS region (512) and a p-type substrate contact region (560) in the DENMOS region (510) are formed by ion implantation of a third set of p-type dopants, typically boron, gallium and/or indium, commonly with a total dose between $1 \cdot 10^{14}$ cm$^{-2}$ and $3 \cdot 10^{16}$ cm$^{-2}$, at energies between 2 and 100 keV. A p-type source-drain photoresist pattern, not shown in FIG. 5D for clarity, defines appropriate regions during ion implantation of the third set of p-type dopants.

Continuing to refer to FIG. 5D, metal silicide is formed on the n-type drain contact region (550), n-type source contact region (552) and p-type substrate contact region (560) in the DENMOS region (510), and on the p-type drain contact region (556), p-type source contact region (558) and n-type substrate contact region (554) in the DEPMOS region (512), by depositing a refractory metal, such as titanium, cobalt or nickel, on the top surfaces of the contact regions (550, 552, 554, 556, 558, 560), followed by depositing an optional cap layer over the refractory metal, reacting the refractory metal with silicon in the contact regions during a thermal process to form metal silicide, and removing unreacted refractory metal and cap layer material, to form a DENMOS drain silicide contact layer (562), a DENMOS source silicide contact layer (564) and a DENMOS substrate silicide contact layer (566) on top surfaces of the respective DENMOS contact regions (550, 552, 560), and a DEPMOS drain silicide contact layer (568), a DEPMOS source silicide contact layer (570) and a DEPMOS substrate silicide contact layer (572) on top surfaces of the respective DEPMOS contact regions (556, 558, 554).

Continuing to refer to FIG. 5D, a PMD (574), typically a dielectric layer stack including a silicon nitride or silicon dioxide PMD liner 10 to 100 nanometers thick deposited by PECVD, a layer of silicon dioxide, PSG or BPSG, commonly 100 to 1000 nanometers thick deposited by PECVD, commonly leveled by a CMP process, and an optional PMD cap layer, commonly 10 to 100 nanometers of a hard material such as silicon nitride, silicon carbide nitride or silicon carbide, is formed on top surfaces of the DENMOS gate (542), the DEPMOS gate (544) and the silicide contact layers (562, 564, 566, 568, 570, 572). A DENMOS drain contact (576), a DENMOS source contact (578), a DENMOS substrate contact (580), a DEPMOS drain contact (582), a DEPMOS source contact (584), a DEPMOS substrate contact (586) are formed in the PMD (574), typically by defining regions for contact holes with a contact photoresist pattern on a top surface of the PMD (574), not shown in FIG. 5D for clarity, removing PMD material in the regions defined by the contact photoresist pattern using known etching methods to expose the silicide contact layers (562, 564, 566, 568, 570, 572), depositing contact metal, typically tungsten, in the contact holes, and selectively removing the contact metal from the top surface of the PMD (574), commonly by known CMP and/or etching processes. A DENMOS gate contact and a DEPMOS gate contact, not shown in FIG. 5D for clarity, are also formed which connect to the DENMOS gate (542) and the DENMOS gate (544), respectively.

During operation of the DENMOS transistor described by the above embodiment, the DENMOS source contact (578) and DENMOS substrate contact (580) are typically connected to potentials within 1 volt of ground potential, and a positive drain potential, typically greater than 4 volts, is applied to the DENMOS drain contact (576). A portion of the n-well (532) adjacent to the p-type compensation region (526) is depleted, causing a significant fraction of the potential difference between the DENMOS drain contact (576) and the DENMOS source contact (578) to occur across the depleted n-well region, resulting in a desirably lower electric field at an interface between the n-well (532) and the MOS gate dielectric layer (540) than would exist in the absence of the p-type compensation region (526). Formation of the p-type compensation region (526) simultaneously with the p-well (524) is advantageous because it provides the benefit of the p-type compensation region without adding fabrication cost or complexity.

Similarly, during operation of the DEPMOS transistor described by the above embodiment, the DEPMOS source contact (584) and DEPMOS substrate contact (586) are typically connected to potentials within 1 volt of ground potential, and a negative drain potential, typically with a magnitude greater than 4 volts, is applied to the DEPMOS drain contact (582). A portion of the p-well (524) adjacent to the n-type compensation region (534) is depleted, causing a significant fraction of the potential difference between the DEPMOS drain contact (582) and the DEPMOS source contact (584) to occur across the depleted p-well region, resulting in a desirably lower electric field at an interface between the p-well (524) and the MOS gate dielectric layer (540) than would exist in the absence of the n-type compensation region (534). Formation of the n-type compensation region (534) simultaneously with the n-well (532) is advantageous because it provides the benefit of the n-type compensation region without adding fabrication cost or complexity.

In a further embodiment, a second DENMOS transistor with a second p-type compensation region is formed in the IC (500) in which a width of the second p-type compensation region is different than a width of the p-type compensation region in the first DENMOS transistor.

In yet a further embodiment, a second DEPMOS transistor with a second n-type compensation region is formed in the IC (500) in which a width of the second n-type compensation region is different than a width of the n-type compensation region in the first DEPMOS transistor, providing a DEPMOS transistor with a different drain voltage and drive current capability compared to the first DEPMOS transistor. This is advantageous because it provides a capability of optimally handling more than one input and output signal with different voltages in the same IC without adding fabrication cost or complexity.

In a preferred embodiment, the p-type compensation region (526) and the n-type compensation region (534) are connected to control potentials that can vary a depletion width between the p-type compensation region (526) and the n-well (532), and can vary a depletion width between the n-type compensation region (534) and the p-well (524). This is advantageous because it provides a method of changing a drain voltage and drive current capability of a single DENMOS transistor, and a drain voltage and drive current capability of a single DEPMOS transistor, during operation of the IC (500), without adding fabrication cost or complexity.

What is claimed is:

1. An integrated circuit (IC) comprising:
    a drain extended metal oxide semiconductor (DEMOS) transistor, further comprising:
       a drain of said DEMOS transistor comprised of a well of a first conductive type;
       an element of field oxide formed in said well;
       a compensation region of a second conductive type formed in said well adjacent to and in contact with said field oxide element, wherein said compensation region extends to less than a depth of the field oxide element;
       a DEMOS gate overlapping a portion of said well, said compensation region and a portion of said field oxide element; and
       a drain contact region of said DEMOS transistor, of said first conductive type, formed in said well on an opposite side of said field oxide element from said compensation region.

2. The IC of claim 1, further comprising a source contact region of said first conductivity type formed adjacent to said DEMOS gate opposite from said drain.

3. The IC of claim 1, further comprising an electrical connection to said compensation region.

4. The IC of claim 1, further comprising:
    a second DEMOS transistor, further comprising:
       a drain of said second DEMOS transistor comprised of a second well of said first conductive type;
       a second element of field oxide formed in said second well;
       a second compensation region of said second conductive type formed in said second well adjacent to and in contact with said second field oxide element, such that a width of said second compensation region is different than a width of said first compensation region;
       a second DEMOS gate overlapping a portion of said second well, said second compensation region and a portion of said second field oxide element; and
       a drain contact region of said second DEMOS transistor, of said first conductive type, formed in said second well on an opposite side of said second field oxide element from said second compensation region.

5. The IC of claim 1, in which:
   said first conductive type is n-type; and
   said second conductive type is p-type.

6. The IC of claim 5, further comprising:
   a p-type substrate;
   an n-type buried layer formed in said p-type substrate;
   a p-channel DEMOS (DEPMOS) transistor formed in said p-type substrate above said n-type buried layer, further comprising:
       a drain of said DEPMOS transistor comprised of a p-type well;
       a second element of field oxide formed in said p-type well;
       an n-type compensation region formed in said p-type well adjacent to and in contact with said second field oxide element;

a DEPMOS gate overlapping a portion of said p-type well, said n-type compensation region and a portion of said second field oxide element; and a p-type drain contact region of said DEPMOS transistor formed in said p-type well on an opposite side of said second field oxide element from said n-type compensation region.

7. The IC of claim 6, further comprising an electrical connection to said n-type compensation region.

8. The IC of claim 6, further comprising:

a second DEPMOS transistor, further comprising:

a drain of said second DEPMOS transistor comprised of a second p-type well;

a third element of field oxide formed in said second p-type well;

a second n-type compensation region formed in said second p-type well adjacent to and in contact with said third field oxide element, such that a width of said second n-type compensation region is different than a width of said first n-type compensation region;

a second DEPMOS gate overlapping a portion of said second p-type well, said second n-type compensation region and a portion of said third field oxide element; and a p-type drain contact region of said second DEPMOS transistor formed in said second p-type well on an opposite side of said third field oxide element from said second n-type compensation region.

9. An IC, comprising: a silicon-on-insulator (SOI) film; a p-type region formed in said SOI film; an n-channel DEMOS (DENMOS) transistor formed in said p-type region, further comprising: a drain of said DENMOS transistor comprised of an n-type well formed in said p-type region; a first element of field oxide formed in said n-type well; a p-type compensation region formed in said n-type well adjacent to and in contact with said first field oxide element, wherein said compensation region extends to less than a depth of the field oxide element; a DENMOS gate overlapping a portion of said n-type well, said p-type compensation region and a portion of said first field oxide element; and an n-type drain contact region of said DENMOS transistor formed in said n-type well on an opposite side of said first field oxide element from said p-type compensation region; an n-type region formed in said SOI film, separate from said p-type region; and a p-channel DEMOS (DEPMOS) transistor formed in said n-type region, further comprising: a drain of said DEPMOS transistor comprised of a p-type well formed in said n-type region; a second element of field oxide formed in said p-type well; an n-type compensation region formed in said p-type well adjacent to and in contact with said second field oxide element; a DEPMOS gate overlapping a portion of said p-type well, said n-type compensation region and a portion of said second field oxide element; and a p-type drain contact region of said DEPMOS transistor formed in said p-type well on an opposite side of said second field oxide element from said n-type compensation region.

10. The IC of claim 9, further comprising an n-type source contact region formed adjacent to said DEMOS gate opposite from said drain.

11. The IC of claim 9, further comprising:

an electrical connection to said p-type compensation region; and an electrical connection to said n-type compensation region.

12. The IC of claim 9, further comprising: a second p-type region formed in said SOI film, which may be contiguous with said first p-type region; a second DENMOS transistor formed in said second p-type region, further comprising: a drain of said second DENMOS transistor comprised of a second n-type well formed in said second p-type region; a third element of field oxide formed in said second n-type well; a second p-type compensation region formed in said second n-type well adjacent to and in contact with said third field oxide element, such that a width of said second p-type compensation region is different than a width of said first p-type compensation region; a second DENMOS gate overlapping a portion of said second n-type well, said second p-type compensation region and a portion of said third field oxide element; and an n-type drain contact region of said second DENMOS transistor formed in said second n-type well on an opposite side of said third field oxide element from said second p-type compensation region; a second n-type region formed in said SOI film, which may be contiguous with said first n-type region, separate from said first p-type region and said second p-type region; and a second DEPMOS transistor formed in said second n-type region, further comprising: a drain of said second DEPMOS transistor comprised of a second p-type well formed in said second n-type region; a fourth element of field oxide formed in said second p-type well; a second n-type compensation region formed in said second p-type well adjacent to and in contact with said fourth field oxide element, such that a width of said second n-type compensation region is different than a width of said first n-type compensation region; a second DEPMOS gate overlapping a portion of said second p-type well, said second n-type compensation region and a portion of said fourth field oxide element; and a p-type drain contact region of said second DEPMOS transistor formed in said second p-type well on an opposite side of said fourth field oxide element from said second n-type compensation region.

* * * * *